United States Patent [19]
Sasaki et al.

[11] Patent Number: 5,543,770
[45] Date of Patent: Aug. 6, 1996

[54] APPARATUS FOR GENERATING UNIFORM AND PARALLEL MAGNETIC FIELD, THE INTENSITY OF WHICH IS VARIABLE

[75] Inventors: Tsutomu Sasaki; Ikuo Itoh, both of Kawasaki, Japan

[73] Assignee: Nippon Steel Corporation, Tokyo, Japan

[21] Appl. No.: 513,033

[22] Filed: Aug. 9, 1995

Related U.S. Application Data

[63] Continuation of Ser. No. 118,240, Sep. 9, 1993.

[30] Foreign Application Priority Data

Sep. 11, 1992 [JP] Japan .................... 4-267798

[51] Int. Cl.$^6$ .................. H01F 5/00; H01F 1/00; H01F 6/00
[52] U.S. Cl. ............... 335/299; 335/216; 336/DIG. 1; 505/211; 505/879
[58] Field of Search ............................ 335/299, 216; 336/DIG. 1; 505/211, 879

[56] References Cited

U.S. PATENT DOCUMENTS

| | | | |
|---|---|---|---|
| H39 | 3/1986 | Gubser | 204/192 S |
| 4,409,579 | 10/1983 | Clem | 335/216 |
| 4,881,035 | 11/1989 | Siebold | 324/320 |
| 5,289,128 | 2/1994 | Demeester | 324/318 |

FOREIGN PATENT DOCUMENTS

| | | |
|---|---|---|
| 0174708 | 3/1989 | Japan . |
| 2-25008 | 1/1990 | Japan . |

OTHER PUBLICATIONS

D. Hechtfischer, "Homogenisation of magnetic fields by diamagnetic shields", J. Phys. E.: Sci Instrum. 20 (1987) Printed in the UK.

Williams et al., "Homogenisation of a Magnetic Field with a Superconducting Cylinder", Physics Letters, vol. 9, No. 2, Apr. 1, 1964, pp. 102–103.

*Primary Examiner*—Leo P. Picard
*Assistant Examiner*—Stephen T. Ryan
*Attorney, Agent, or Firm*—Wenderoth, Lind & Ponack

[57] ABSTRACT

A device for producing a uniform, parallel, intensity-variable magnetic field includes at least one coil and/or permanent magnet for producing a magnetic field, and a cylinder which contains a superconductor and which has a slit extending parallel to its axial direction. The axis of the coil and/or the permanent magnet and the axis of the cylinder are parallel to each other. The superconductor is a type II superconductor which has a critical current density not equal to zero under a magnetic field higher than its lower critical magnetic field. Furthermore, the cylinder may comprise several superconductor sheets joined together into a cylindrical shape or a superconductor-containing sheet which is wound spirally about itself or is rolled up several times about itself in the form of a hollow cylinder.

15 Claims, 22 Drawing Sheets

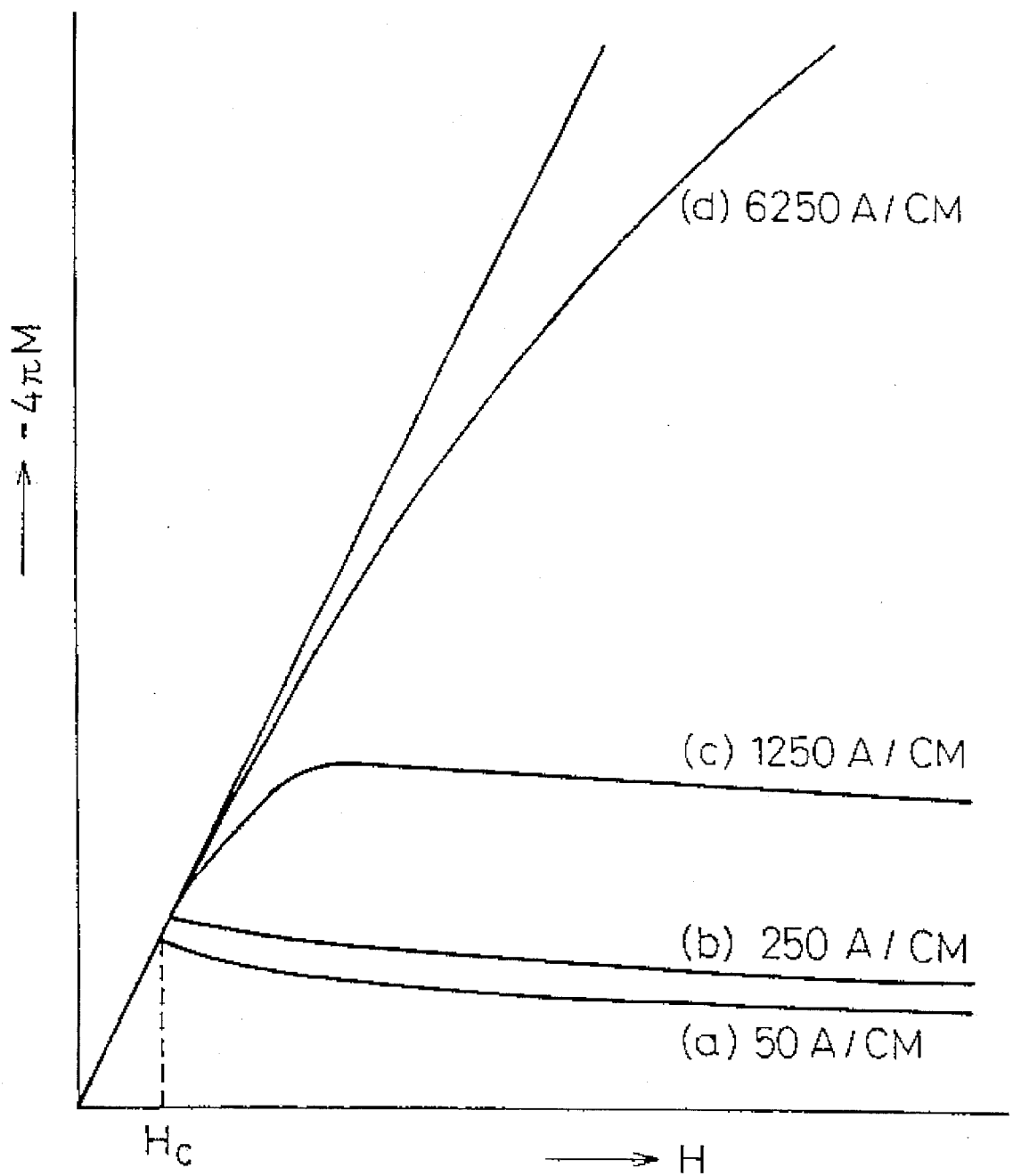

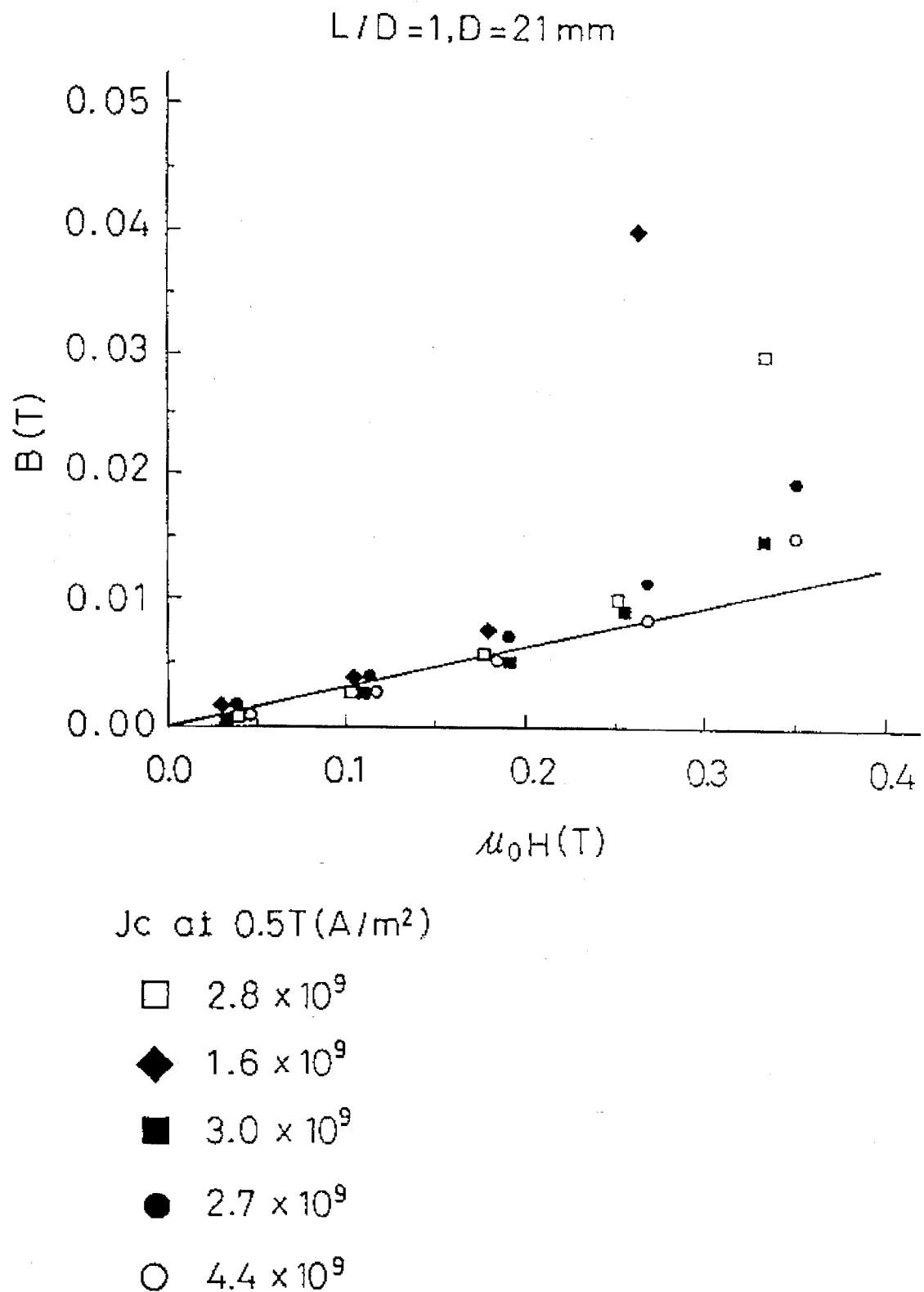

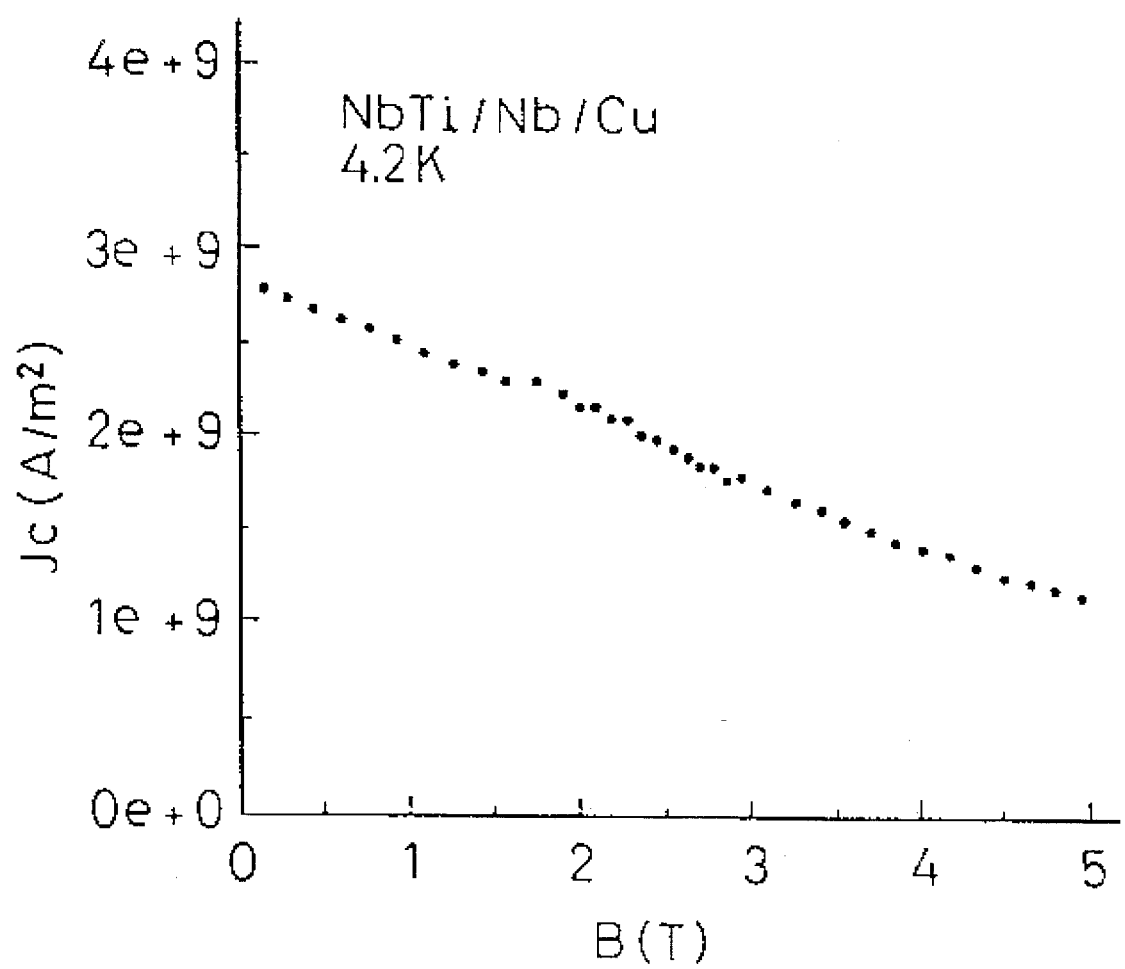

25

APPARATUS FOR GENERATING UNIFORM AND PARALLEL MAGNETIC FIELD, THE INTENSITY OF WHICH IS VARIABLE

This application is a continuation of now abandoned application Ser. No. 08/118,240, filed Sep. 9, 1993.

BACKGROUND OF THE INVENTION

1. Field of the Invention

The present invention relates to a magnetic-field producing apparatus for producing a uniform, parallel magnetic field. More particularly, this invention relates to a type of magnetic field producing device which comprises a type II superconductor and a magnetic-field source such as an electromagnet, a permanent magnet or the like. This device can be used in applications such as a nuclear magnetic resonance-computed tomograph (MRI) and the like which require uniform and parallel magnetic fields.

2. Description of the Related Art

In a device such as an MRI or the like which requires a magnetic field of a high degree of uniformity, electromagnets and permanent magnets are used for the production of this magnetic field. The electromagnets of this kind include superconducting electromagnets in which superconducting wires are used and normal-conducting electromagnets in which copper wires or aluminum wires are coil-wound.

For a magnetic field which is below 0.3 T (tesla), the device which uses the permanent magnets will generally be an economical system. However, if a magnetic field over 0.3 T is required, only a superconducting electromagnet can produce such a magnetic field. In addition, since a superconducting electromagnet can produce a magnetic field having excellent uniformity and stability, it is possible to obtain a uniform, high-intensity, time-stable magnetic field (up to several Ts). Therefore a superconducting electromagnet is generally used as a magnet for an MRI.

In the above-mentioned super- or normal-conducting electromagnet, a solenoid form, a double Helmholtz form or the like is adopted for the coil structure and each of these forms can be varied as required.

A sectional view of an example of a known device which produces a uniform, parallel magnetic field by using superconducting electromagnets is shown in FIG. 1. As shown in FIG. 1, superconducting coils 2 are placed at both axial ends of a ring-shaped, very low 10 temperature vessel (referred to as a "cryostat" hereinafter) 1. The magnetic fields emitted by the superconducting coils 2 include curved components extending from the vicinity of the central portion of a cylinder axis 4 toward the outside of this cylinder axis. In order to make those magnetic fields parallel to the cylinder axis 4, another superconducting coil 3 is placed in the vicinity of the central portion of the cylinder axis 4. In order that a given central region of the magnetic fields produced by the superconducting coils 2, 3 is made generally parallel to the cylinder axis 4, the positions and shapes of these coils are suitably determined, and the currents supplied to these coils are appropriately adjusted. Thus, the distribution of the magnetic flux (F) generated by the superconducting coils 2, 3 has the form shown in FIG. 2.

On the other hand, the production of uniform and parallel magnetic fields by making use of perfect diamagnetism of superconductors has been proposed for a long time. For example, Williams et al. demonstrated the effectiveness of this concept through their experiments (W. L. Williams et al.: Phys. Lett. 9 (1964) 102). Furthermore, in the above-mentioned literature, Onsager reported in private that it is possible to produce a uniform magnetic field by using a sheet of a superconductor wound in a spiral shape. Moreover, Hechtfisher demonstrated that it is possible to produce a uniform magnetic field by using a superconductor foil rolled up one layer over another in the form of a hollow cylinder (D. Hechtfisher: J. Phys. E: Sci. Instrum. 20 (1987) p.143).

According to the above-mentioned method proposed by Williams et al., it is possible to produce a uniform, time-stable magnetic field. On the other hand, according to the above-mentioned method proposed and demonstrated by Hechtfisher, it is possible to produce a uniform, intensity-variable magnetic field.

These methods produce uniform magnetic fields or make magnetic fields uniform according to the following principles.

When a superconductor is perfectly diamagnetic, that is to say, when the magnetic field is below its critical magnetic field (Hc) if the superconductor is a type I superconductor, or when the magnetic field is below its lower critical magnetic field ($Hc_1$) if the superconductor is a type II superconductor, this superconductor exhibits a Meissner effect, and the magnetic flux density (B) within the superconductor becomes zero. This can be expressed in the form that the magnetic permeability ($\mu$) of the superconductor is equal to zero.

A type I superconductor assumes its normal conducting state when a magnetic field applied to it is greater than its critical magnetic field (Hc). The materials of the type I superconductor include In (Hc(0K)=0.03 T), Sn (Hc(0K)= 0.03 T), Pb (Hc(4.2K)=0.08 T) and the like. On the other hand, a type II superconductor is perfectly diamagnetic when a magnetic field applied to it is less than its lower critical magnetic field ($Hc_1$). When the applied magnetic field is greater than this lower critical magnetic field ($Hc_1$), this gives rise to a mixed state in which the magnetic field has penetrated into the superconductor in the form of quantized magnetic flux. As a result, this superconductor is still in its superconducting state but has lost its perfect diamagnetism. Furthermore, when the applied magnetic field reaches the upper critical magnetic field ($Hc_2$), the superconductor returns to its normal conducting state. The materials which show such characteristics include Nb—Ti ($Hc_1$(4.2K)=up to 0.01 T, $Hc_2$(4.2K)=up to 10 T), $Nb_3Sn$, Y—Ba—Cu—O ($Hc_1$(0K)=up to 0.04 T, $Hc_2$(0K)=up to 100 T) referred as a "high-temperature oxide superconductor", Bi—Sr—Ca—Cu—O and the like.

The normal component of magnetic flux density (B) which passes the boundary surface between two materials whose magnetic permeabilities ($\mu$) are different from each other, must be continuous across the boundary surface. Therefore, when the surface of the superconductor is in contact with a vacuum, only the magnetic field (i.e., magnetic flux density) which is parallel to the superconductor surface can exist in the vacuum, since magnetic flux density (B) inside the superconductor is equal to zero. This is explained by reference to FIG. 3A and FIG. 3B.

In each of these figures, a superconductor is in contact with a vacuum on the boundary indicated by the line segment A–A'.

In the case of FIG. 3A, since the normal component of magnetic flux density (B) which is perpendicular to the boundary surface (i.e., the surface of the superconductor) must be continuous across the boundary surface, this normal component must also exist inside the superconductor as shown by the arrow in the figure, which is contradictory to the requirement that the magnetic flux density (B) must be equal to zero. In other words, only when the magnetic flux density (B) is parallel to the boundary surface as shown in FIG. 3B, does it become possible to satisfy both the requirement that the magnetic flux density (B) must be equal to zero and the requirement that the normal component must be continuous across the boundary surface.

The above-mentioned methods rectify magnetic flux flows of a whole magnetic field system and produce a uniform magnetic field by incorporating this boundary condition into the magnetic field system.

Furthermore, the above-mentioned boundary condition is satisfied only when the superconductor is perfectly diamagnetic.

Therefore, by making use of this boundary condition and by cooling a cylinder of a superconductor material under an axial magnetic field to place this cylinder in its superconducting state, it is possible to trap magnetic flux inside the cylinder or to produce a uniform, parallel magnetic field inside the cylinder.

For example, in a completely hollow cylinder 21 made of a superconductor material as shown in FIG. 4, the magnetic flux indicated by the vector B is trapped in the bore of this cylinder. FIG. 5 is a sectional view which shows the axial distribution of magnetic flux F in this cylinder 21. As shown by this figure, a uniform magnetic field is produced inside the cylinder 21.

Furthermore a cylinder 22 comprising a sheet of superconductor material wound in a tight spiral is shown FIG. 6A. A magnetic field is applied in parallel to the axial direction of the cylinder 22 so that the magnetic field inside the bore of this cylinder can be made uniform.

Furthermore a cylinder 23 comprising a superconductor foil rolled up several times in the form of a hollow cylinder is shown in FIG. 7. FIG. 8 shows the situation in which a magnetic field is applied parallel to the axial direction of the cylinder 23 shown in FIG. 7 so that the magnetic field inside the bore of this cylinder can be made uniform. In this arrangement, a solenoid coil 11 is placed outside the cylinder 23 and the magnetic field is formed parallel to the axial direction of the cylinder 23.

Among these methods, in the method in which a magnetic field is trapped inside the cylinder 21, the magnetic field trapped inside this cylinder has a high degree of time stability, since the magnetic flux which intersects a closed curve inside the superconductor (for example, a circle perpendicular to the cylinder axis) is temporally invariable (this method will be referred to as the "Williams' method" hereinafter). On the other hand, when a cylinder comprises a sheet of a superconductor wound spirally or rolled up several times in the form of a hollow cylinder, it is possible to vary a magnetic field inside the superconductor cylinder 22 or 23, for example, by varying the electric current supplied to the outer magnet, since there is no closed loop which is perpendicular to the axis of the cylinder 22 or 23 (this method will be referred as "Onsager's method" hereinafter).

The above-mentioned methods for producing a uniform magnetic field have several technical, economic and practical problems.

First of all, a superconductor wire used for the composition of a superconducting electromagnet is required to satisfy several strict conditions.

For example, since the superconductor wire is a long wire, it is necessary that the critical current density (Jc) in its longitudinal direction be highly uniform and that the tolerance of the wire diameter be small. Moreover, an extremely sophisticated winding technique is required because the coil portion of the superconducting wire has a very complicated structure. In addition to this, since any slight deformation caused by cooling can be problematic, complicated mechanisms and complex procedures such as numerical calculation, etc., are needed in order to compensate for the degradation of the magnetic field caused by the deformation of the coil portion and to compensate for an undesired magnetic field which cannot be canceled by a solenoid coil.

Furthermore, for an MRI application, an apparatus whose center magnetic field has a magnetic flux density of 1.5 T is currently required. In this type of apparatus, an active shield technique is adopted in order to overcome such hindrances as installation weight and leakage magnetic field, which increases the necessary quantity of the superconductor wire. This forces up the manufacturing cost of the apparatus and hinders the commercial applicability.

For example, such a superconducting magnet is conventionally formed in the manner shown in FIG. 1 for the production of a uniform, parallel magnetic field. However, as shown in FIG. 2, in this arrangement it is difficult to achieve a uniform, parallel magnetic field in a broad area along the axial direction of the cylinder by adjusting the position and shape of the superconducting coil and by adjusting the electric current supplied to this coil. For example, the axial length of the usable area of the magnetic field is less than about one-fourth the axial length of the superconducting coil installed and, on the other hand, the radial length of this usable area is less than about one-half the radius of the superconducting coil. As an inevitable result, an apparatus using such a superconducting coil configuration must be bulky.

On the other hand, the arrangement according to the above-mentioned Williams' method or Onsager's method which uses the perfect diamagnetism of a superconductor is simpler than the arrangement shown in FIG. 1 and makes it possible to expand the usable area of a uniform magnetic field. In other words, since the size of a superconducting coil can be reduced, it is possible to lower the manufacturing cost of such an apparatus. However, the magnetic flux density of a magnetic field produced by means of these methods cannot, by way of example, exceed 50 mT, which makes it impossible to use these methods in order to produce a uniform, strong magnetic field. This difficulty is caused by the adoption of Pb which is a type I superconductor as a superconductor material, because the Hc (which is the upper limit permitting the perfect diamagnetism of the superconductor) of this Pb is relatively high and is about 0.08 T at the liquid helium temperature of 4.2K which is practical for industrial purposes.

For a well known type II superconductor which exhibits superconductivity at a temperature of 4.2K, its $Hc_1(4.2K)$ which is the upper limit permitting its perfect diamagnetism is lower than the Hc of Pb. Furthermore, in the case of a high temperature oxide of a type II superconductor which exhibits superconductivity even at the liquid nitrogen temperature of 77.3K which is practical for industrial purposes, its $Hc_1$ at 77.3K is lower than the Hc of Pb at a temperature of 4.2K. This results from the physical property values, such as Hc and $Hc_1$, and, therefore, is an inherent problem of the material.

In addition, an effective magnetic field which actually influences a superconductor becomes higher than an applied magnetic field because of a diamagnetizing field. For this reason, the superconductor may reach its Hc and lose its perfect diamagnetism even under a relatively low magnetic field. Therefore, in the above-mentioned example of Pb, the above-mentioned methods are considered to be useful only under an applied magnetic field which is lower than the above-mentioned values. (See the above-mentioned article by Williams et al., the above-mentioned article by Hechtfisher or general textbooks written on superconductivity— e.g. Michael Tinkham: Introduction to Superconductivity (McGraw-hill, 1975).)

SUMMARY OF THE INVENTION

The object of the present invention is to provide a device for producing a uniform, parallel, intensity-variable magnetic field, which can overcome the above-mentioned problems and can, easily and economically, produce a uniform, parallel magnetic field of required intensity.

According to the present invention, a device for producing a uniform, parallel, intensity-variable magnetic field comprises at least one coil and/or at least one permanent magnet for producing a magnetic field, and a superconductor-containing cylinder which has a slit extending parallel to its axial direction. The axis of the coil and/or the permanent magnet and the axis of the cylinder are parallel to each other, and the uniform, parallel, intensity-variable magnetic field is produced in the axial direction of said cylinder. The superconductor is a type II superconductor having a critical current density unequal to zero under a magnetic field which is greater than its lower critical magnetic field.

The superconductor-containing cylinder comprises a superconductor-containing sheet which is wound spirally and/or is rolled up several times in the form of a hollow cylinder. Alternatively, the superconductor-containing cylinder can comprise several superconductor-containing sheets which are joined together in the form of a hollow cylinder. Furthermore, in the above-mentioned device, the thickness of the superconductor portion of the cylinder is preferably greater than the thickness which allows the maximum value of a magnetic field on the cylinder surface to correspond to a center-reaching magnetic field.

Moreover, the superconductor-containing cylinder is placed inside or outside of the coil with the cylinder and the coil being coaxial.

Furthermore, the superconductor-containing cylinder can be placed between at least two coils or permanent magnets with the coils or permanent magnets and the cylinder being coaxial.

Furthermore, the superconductor-containing cylinder can be placed to the N-pole side and/or the S-pole side of a permanent magnet with the permanent magnet and the cylinder being coaxial.

Thus, according to the present invention, a closed-loop current passage which is perpendicular to the cylinder axis is eliminated through the formation of the axial slit in the cylinder. Accordingly, it is possible to vary a magnetic field inside the cylinder by varying the magnetic field intensity of the outer magnet and to realize the production of a uniform, parallel, intensity-variable magnetic field.

Assuming that the above-mentioned permanent magnet is replaced with a surface current which is equivalent to the permanent magnet, the axis of this permanent magnet will coincide with the axis of a surface portion of the cylinder on which the surface current flows (this surface portion usually has the form of a tube having a circular, elliptical, or polygonal section). Furthermore, the above-mentioned slit extends from the top to the bottom of the cylinder. The width of this slit is preferably as small as possible so long as both edges across the slit are non-superconductively in contact with each other.

BRIEF DESCRIPTION OF THE DRAWINGS

FIG. 9 is a graph showing a known magnetization curve conceding a type II superconductor cylinder;

FIG. 10 is a graph showing the relation between magnetic flux and a parallel magnetic field for a Nb—Ti/Nb/Cu superconductor cylinder at a temperature of 4.2K;

FIG. 18 is a graph showing a Jc-B characteristic of a superconductor used in the present invention;

DETAILED DESCRIPTION OF THE PREFERRED EMBODIMENTS

Figure 1:
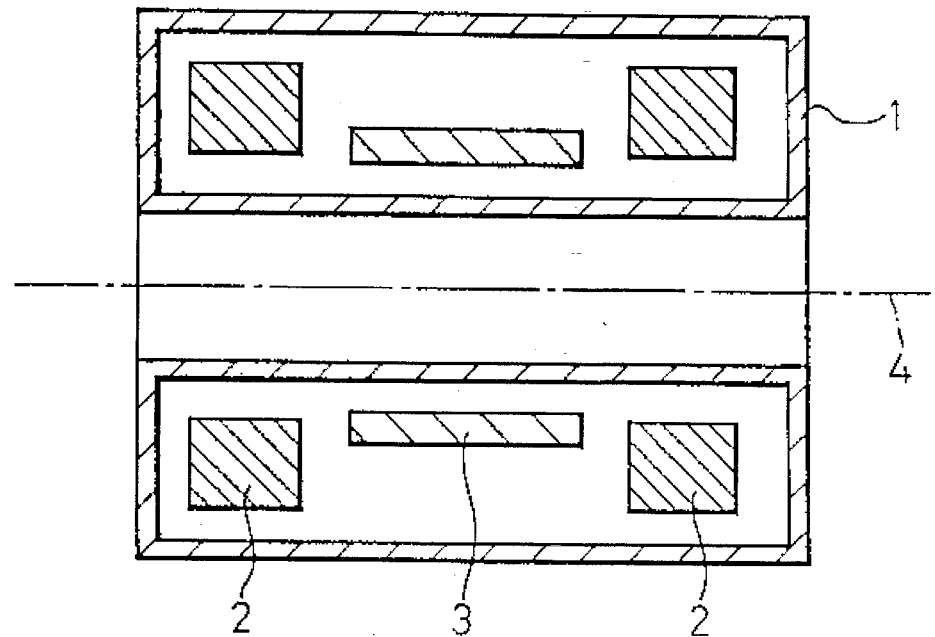
FIG. 1 is a sectional view of a schematic of a conventional magnetic field producing device.
Figure 2:
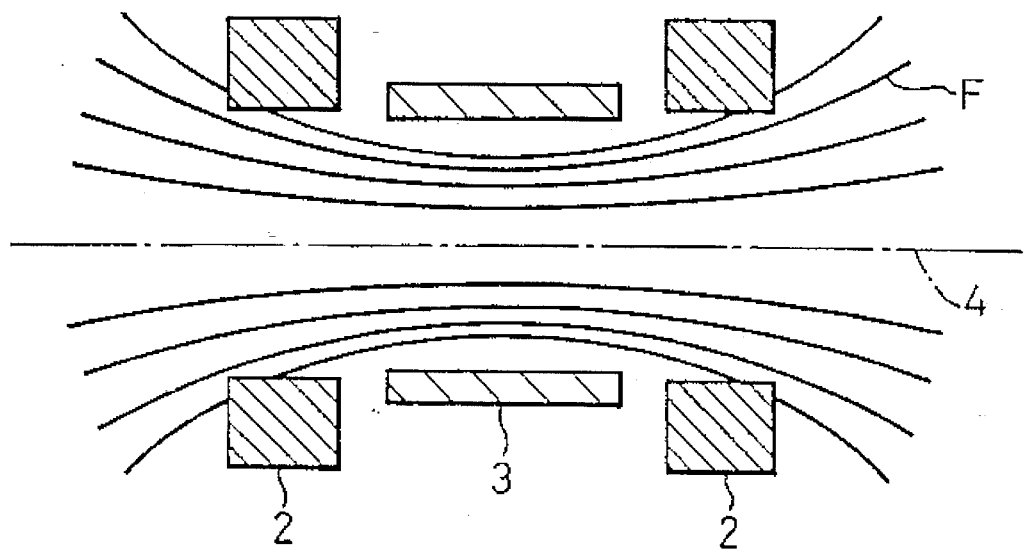
FIG. 2 schematically shows the distribution of the magnetic flux produced inside the device of FIG. 1.
Figure 3A:
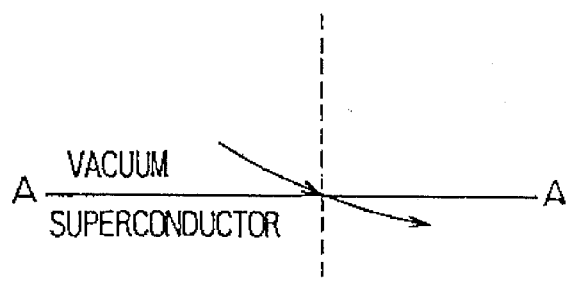
FIG. 3A shows the boundary condition of the perfect diamagnetism on a superconductor surface in a vacuum.
Figure 3B:
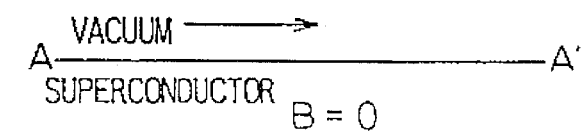
FIG. 3B shows the boundary condition of the perfect diamagnetism on a superconductor surface in a vacuum.
Figure 4:
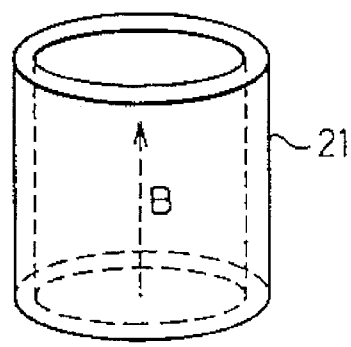
FIG. 4 is a perspective view of a conventional superconductor cylinder.
Figure 5:
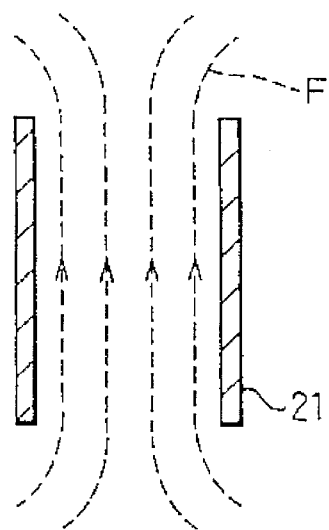
FIG. 5 is a sectional view of the same, schematically showing the distribution of the magnetic flux produced inside the device of FIG. 4.
Figure 6:
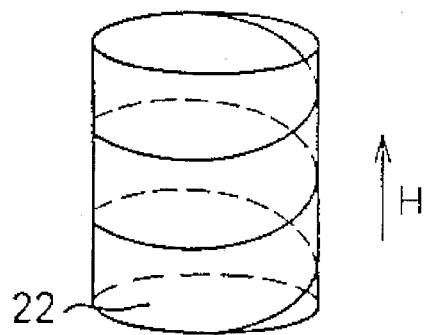
FIG. 6 is a perspective view of another type of conventional superconductor cylinder.
Figure 7:
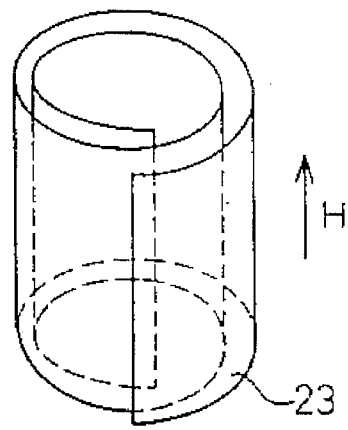
FIG. 7 is a perspective view of still another type of conventional superconductor cylinder.
Figure 8:
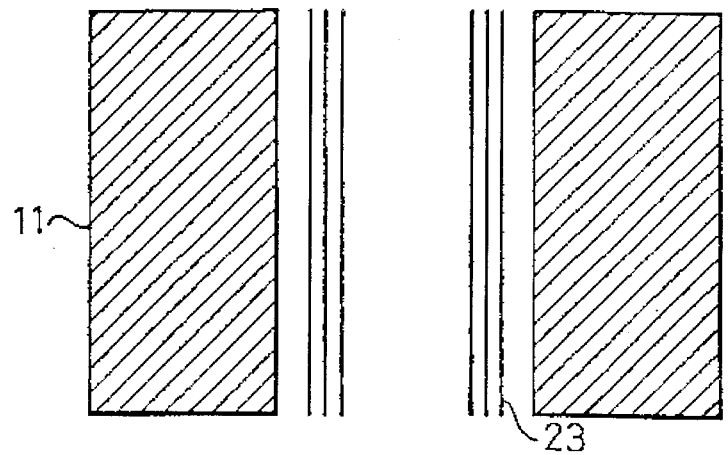
FIG. 8 is a sectional view of a schematic of the superconductor cylinder of FIG. 7.

Before the description of embodiments of the present invention proceeds, the principle related to this invention will first be described.

In the above-mentioned Williams' method and Onsager's method, it has been considered that the magnetic fields have limitations because of the physical property values (e.g., Hc or $Hc_1$) peculiar to the superconductor material used and because of the inevitable phenomenon that an effective magnetic field is increased by a demagnetized field.

In a type II superconductor, it is known that its magnetization curve, in particular, an initial magnetization curve of the type II superconductor, approaches a straight line which represents the perfect diamagnetism of the superconductor as the critical current density (Jc) of the superconductor increases, as shown in FIG. 9 (See, e.g., Naito, M. et al. Phys. Rev. B 41 (1990) 4823).

However, this can only be valid up to the magnetic field which is several times as high as the $Hc_1$ (for example, several times 0.01 T in the case of Nb—Ti at a temperature of 4.2K). Therefore, it is inconcernable that a practical magnetic field intensity of more than 0.2 T or 0.3 T which is, for example, required for an MRI, could be achieved only by combining this knowledge with the above-mentioned Williams' method and Onsager's method.

Nevertheless, the inventors have been able to produce a uniform magnetic field as strong as 0.5 T at a temperature of 4.2K (about 50 times as strong as the $Hc_1$ of Nb—Ti) through prudent consideration of this phenomenon and through cautious analysis of the results which were experimentally obtained.

For a cylinder made of a superconductor, it can be inferred that, when a magnetic field is applied parallel to the axis of the cylinder, the area of penetration of this applied magnetic field has a substantially circular shape and the degree, (i.e., thickness), of this area of penetration is, as a first approximation, proportional to the applied magnetic field H/Jc. That is to say, if the superconductor has its Jc under a magnetic field which is even higher than $Hc_1$, the magnetic field only penetrates the superconductor slightly when its Jc is high or when the superconductor is placed under a lower magnetic field.

For a cylinder open at both ends and comprising an Nb—Ti/Nb/Cu multilayered sheet, FIG. 10 shows the variations of axial flux density (B) inside the cylinder which were observed when a magnetic field (H) was applied parallel to the axis of the cylinder at a temperature of 4.2K.

This cylinder is made by the deep-drawing and the cutting of an Nb—Ti/Nb/Cu multilayered sheet 0.75 mm thick. This cylinder is open at its ends and has an inner diameter of 21 mm and a height of 21 mm. The straight line shown in FIG. 10 represents the theoretical values which indicate the degrees of the penetration of leakage magnetic fields from both of the open ends of the cylinder on the supposition that the superconductor cylinder is perfectly diamagnetic (Thomasson, J. W. et al., Rev. Sci, Instrum. 47 (1976) 387). As can be seen in this figure, this superconductor cylinder appears to be almost perfectly diamagnetic up to several tens of times the $Hc_1$ of Nb—Ti. Furthermore, the maximum value ($H_1$max) of the magnetic field at which the superconductor cylinder seems to be perfectly diamagnetic increases as the Jc increases.

Therefore, it has become obvious that the magnetization curve of a superconductor is considerably different from the already known facts and predictions with regard to a superconductor which has the same Jc.

This finding is illustrated by FIG. 11A to 11D as follows.

Figure 11A:
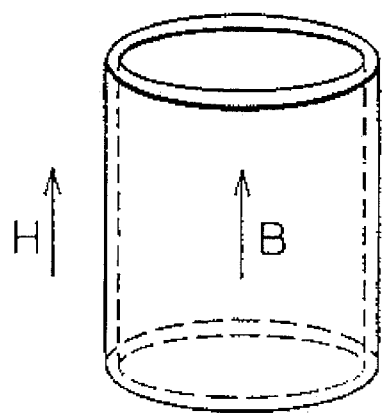
FIG. 11A is a perspective view of a type II superconductor cylinder.
Figure 11:
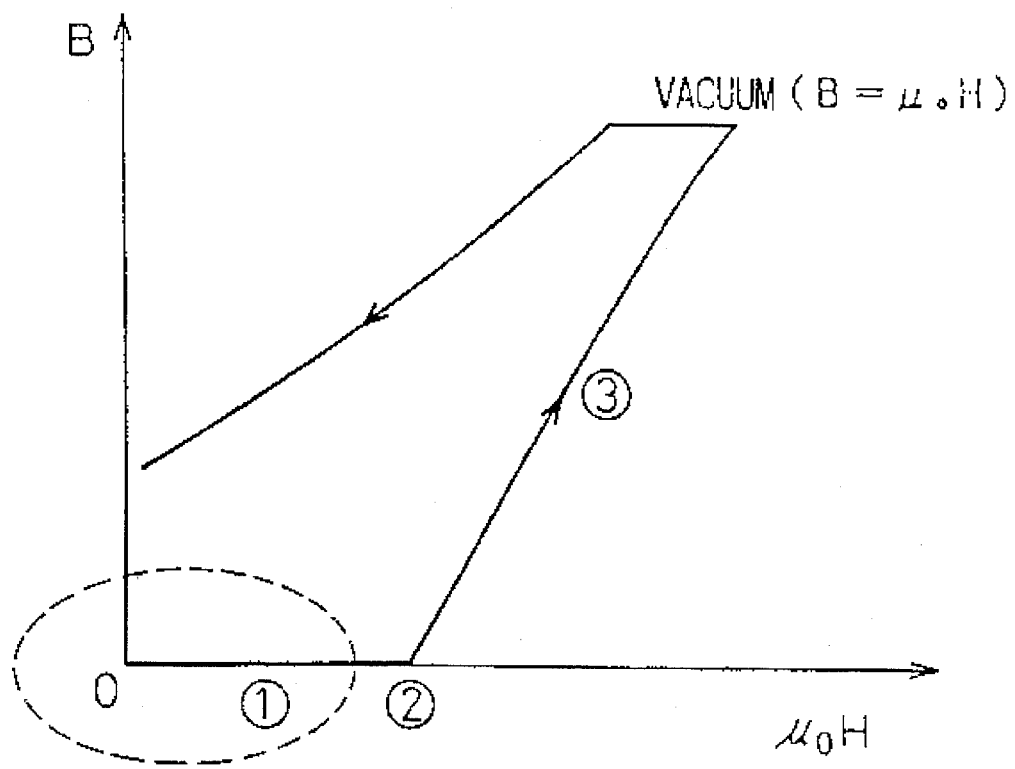
FIG. 11B is a graph showing a typical B-H curve for the superconductor cylinder of FIG. 11A.
FIG. 11C is a graph showing a flux density distribution over the cross section of the cylinder of FIG. 11A.
FIG. 11D is a graph showing, on an enlarged scale, the portion surrounded by the ellipse in FIG. 11B.
Figure 11C:
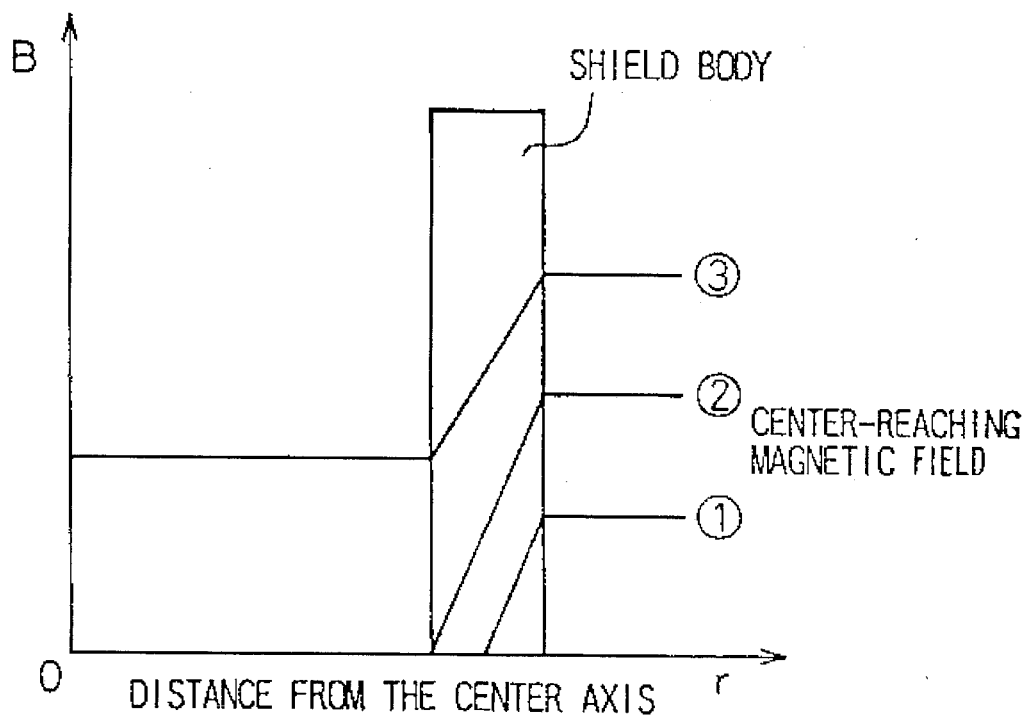
Figure 11D:
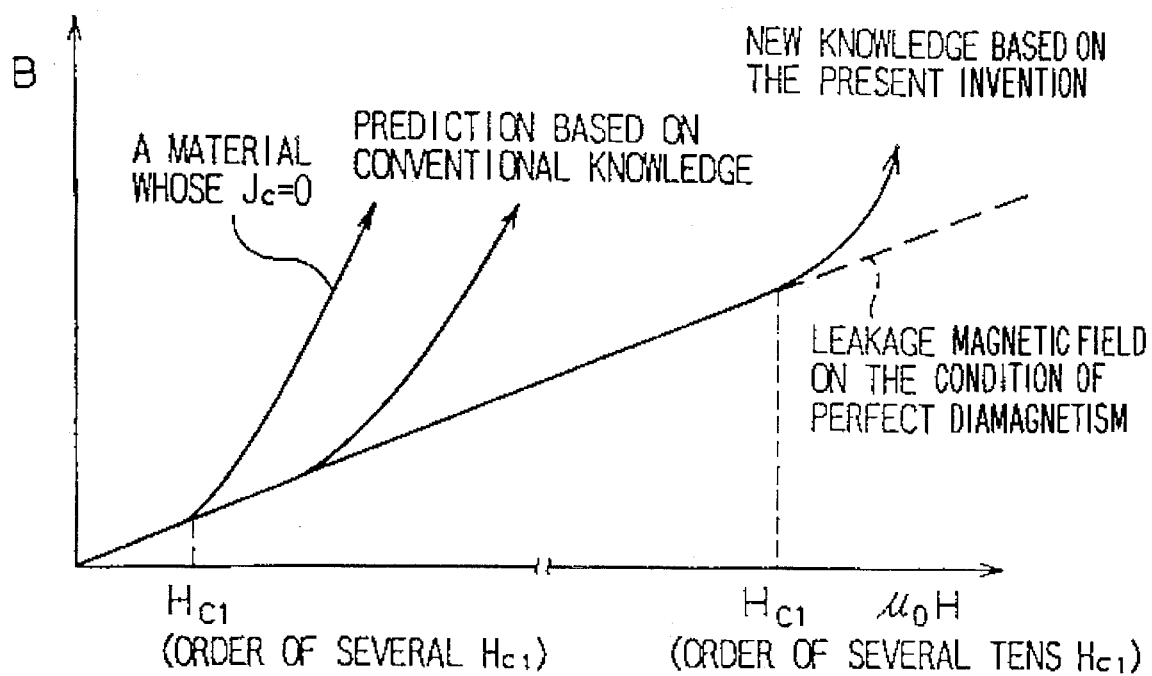

FIG. 11A shows the cylinder open at both ends which was used for the experiments. FIG. 11B is a graph showing the typical results of the experiments. FIG. 11C a graph showing, in correspondence to FIG. 11B, the distribution of the magnetic flux density in the cross section of the cylinder. FIG. 11D is a graph showing the B-axis portion enclosed by a ellipse in FIG. 11B on an enlarged scale. This FIG. 11D is also applicable, as a typical form, to the above-mentioned FIG. 10.

Referring to FIG. 11D, from the comparison of the effect given by a superconductor material whose Jc is not zero, with the effect presumed from conventional knowledge and with the effect given by a superconductor material whose Jc is zero, it was learned that the magnetic field area in which a superconductor appears to be perfectly diamagnetic is wide.

Usually, in order to obtain the magnetization curve, a vibrating-sample-type flux meter (VSM), a SQUID flux meter or the like is used with a superconductor fragment, as a measurement sample, which has a maximum thickness of 1 mm and an area of several millimeters by several millimeters. Therefore, in comparison with the experiments which use the superconductor cylinder, the ratio of a flux penetration area to sample size is considered to be obviously larger (it is only proportional to H/Jc and is not dependent on sample sizes).

In other words, a new fact has been found that the magnetic field area in which a type II superconductor appears to be perfectly diamagnetic can be expanded not only by increasing its Jc but also by reducing the volume ratio of a flux penetration area to a whole magnetic flux system.

Figure 12:
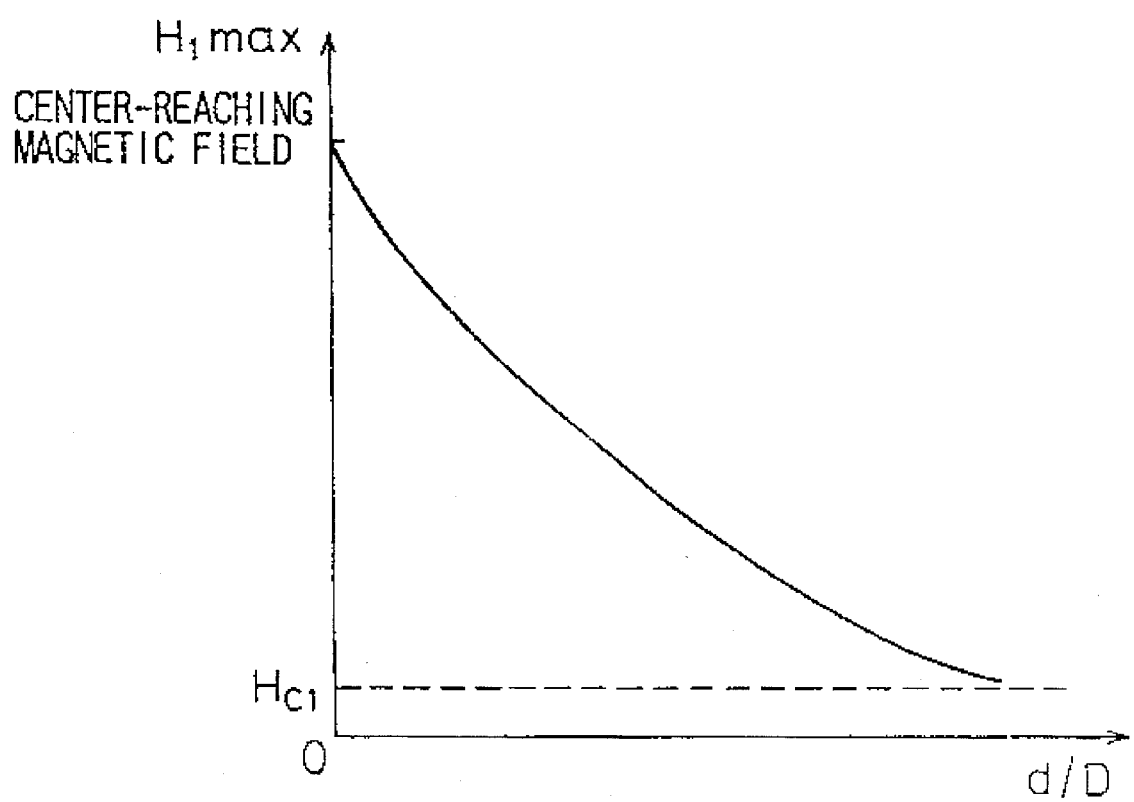
FIG. 12 is a graph showing the relation between the ratio (d/D) of "the thickness (d) of a magnetic flux penetrating region" to "the radius (D) of a type II superconductor cylinder" and a center-reaching magnetic field ($H_1$max)
Figure 13:
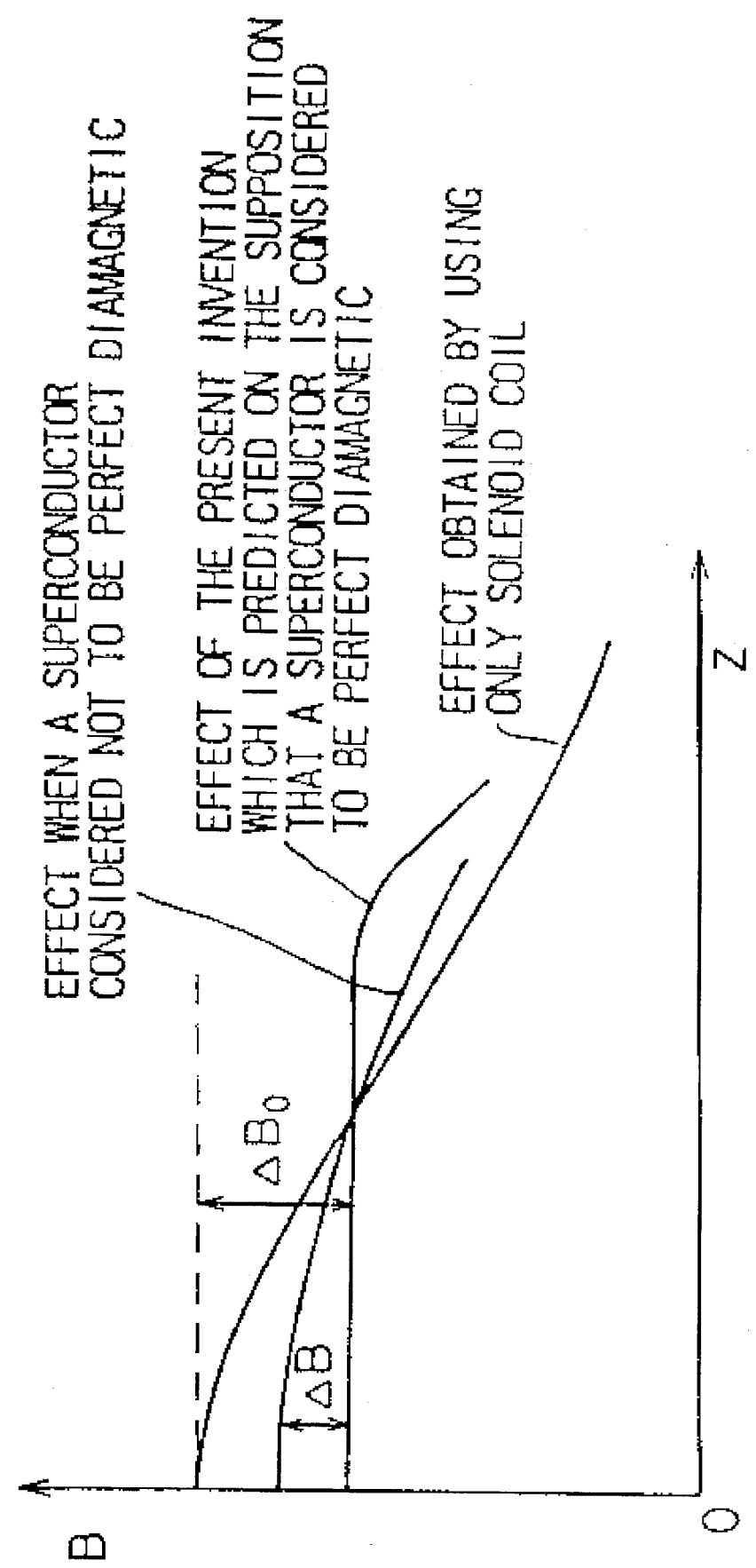
FIG. 13 is a graph showing the relation between the divergence ($\Delta B/\Delta B_0$) from the perfect diamagnetism of a superconductor cylinder and the axial direction (z) of the cylinder.

In the case that a magnetic field is applied to a superconductor cylinder in the direction parallel to the axis of the cylinder, where "D" is the diameter of the cylinder and "d" is the thickness of the flux penetration area, the maximum value ($H_1$max) of a magnetic field at which the superconductor cylinder appears to be perfectly diamagnetic varies in accordance with a ratio d/D as shown in FIG. 12. When D is infinity and d/D is equal to zero, the maximum value ($H_1$max) reaches a center-reaching magnetic field, as shown in FIG. 11C.

The present invention is realized through the combination of the new fact mentioned above and the prior arts.

According to the present invention, even when a magnetic field stronger than $Hc_1$ is applied to a superconductor, this superconductor behaves as if it were perfectly diamagnetic, and thus the magnetic flux never has a component which is normal to the surface of the superconductor. In addition to this, the magnetic field distribution is rectified and the production of a uniform, parallel, intensity-variable magnetic field is realized.

While magnetic fields produced by using the conventional methods (the Williams' method and Onsager's method) are limited to 50 mT, a magnetic field produced according to the present invention can reach 500 mT. Furthermore, it is possible to produce an even stronger, uniform, parallel magnetic field by using a superconductor material which has high Jc.

Moreover, a device according to the present invention can be used in combination with any kind of magnetic field source.

Figure 14:
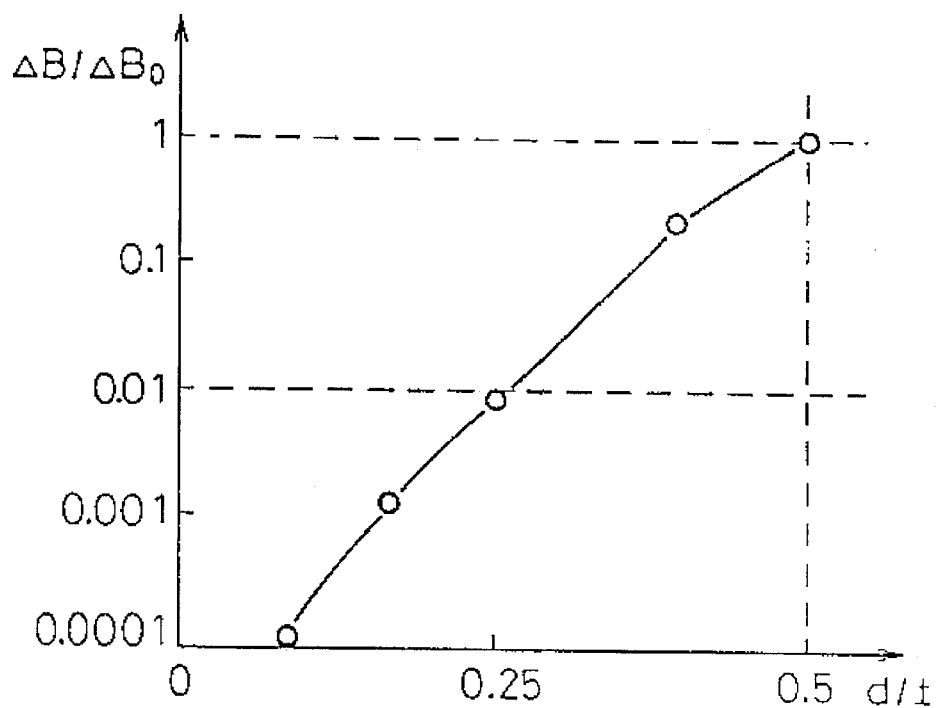
FIG. 14 is a graph showing the relation between the ratio (d/t) of a magnetic field penetrating depth (d) to a superconductor thickness (t) and the divergence ($\Delta B/\Delta B_0$) from the perfect diamagnetism of the superconductor.
Figure 15:
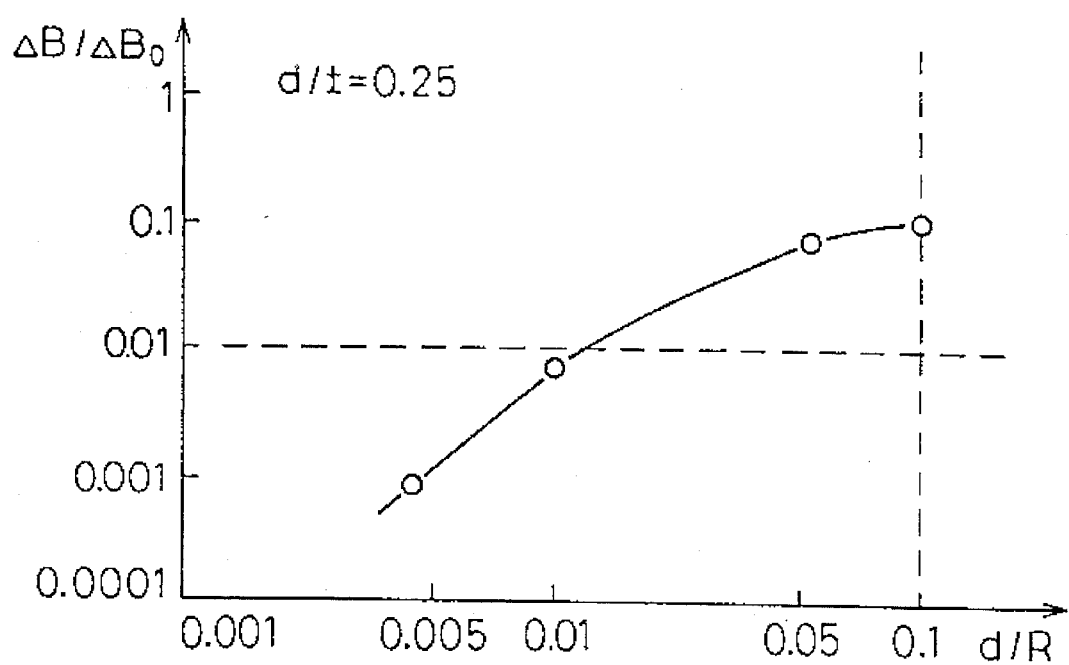
FIG. 15 is a graph showing the relation between the ratio (d/t) of the magnetic field penetrating depth (d) to the radius (R) of the rolled-up cylinder and the divergence ($\Delta B/\Delta B_0$) from the perfect diamagnetism of the superconductor.

In addition, assuming that the practically acceptable minimum divergence from the perfect diamagnetism of a superconductor is 1%, the relation between a magnetic field penetrating depth ($d \approx B/\mu_0 Jc$) of a magnetic field to be made uniform (B) and the superconductor thickness (t) of a slit cylinder, and the relation between the radius (R) of the slit cylinder and the magnetic field penetrating depth (d), can be written in the following forms.

Where the divergence from the perfect diamagnetism of a superconductor is represented as $\Delta B/\Delta B_0$, the relation $d \leq \frac{1}{4} t$ is preferable as can be seen in FIG. 14 and the relation $d \leq \frac{1}{100} R$ is preferable as can be seen in FIG. 15.

Next, embodiments of a magnetic field producing device according to the present invention will be described below with reference to the attached drawings.

In these embodiments, the corresponding parts or similar parts in each of the drawings are indicated by the same reference numerals.

Embodiment 1

Figure 16:
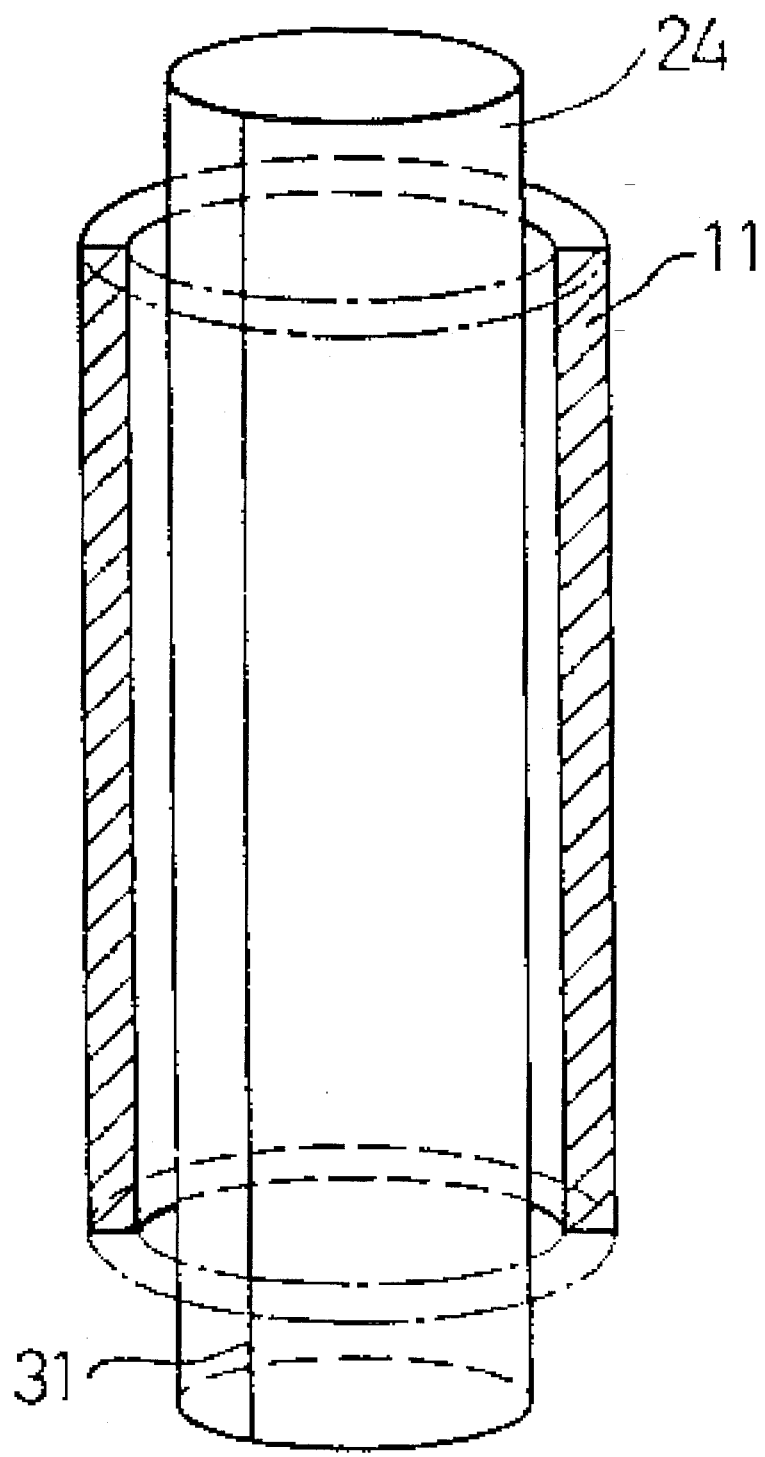
FIG. 16 is a perspective view, partially cut away, of the first embodiment of a magnetic field producing device according to the present invention.
Figure 17A:
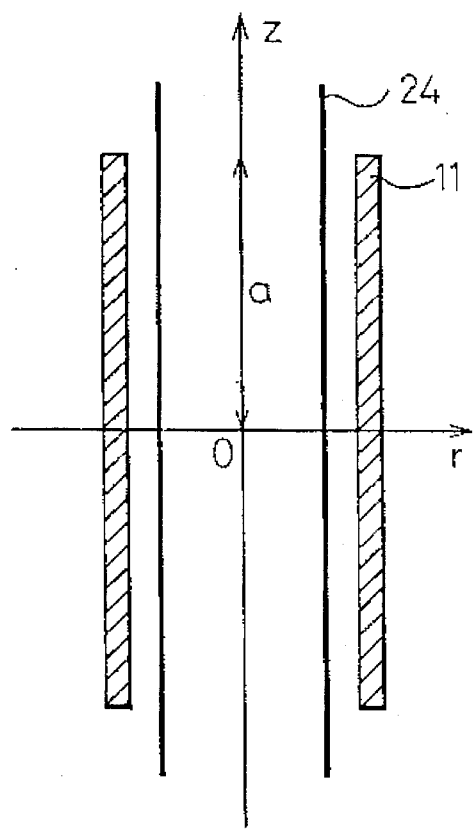
FIG. 17A is a sectional view of a schematic of the device of FIG. 16.
Figure 17B:
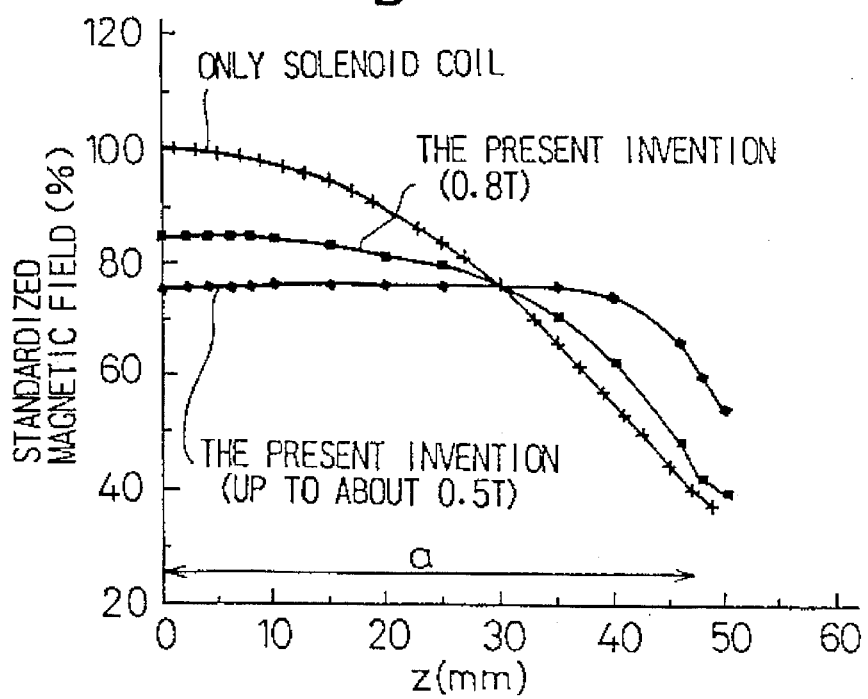
FIG. 17B is a graph showing a magnetic field distribution in the z-direction indicated by the arrow in FIG. 17A.

FIG. 16 shows the first embodiment of a magnetic field producing device according to the present invention. In this figure, a solenoid coil 11 placed outside the cylinder is shown partially cut away. Numeral 24 designates a superconductor-containing cylinder in which a slit 31 is formed parallel to the axial direction of the cylinder. FIG. 17A is a longitudinal sectional view of the device shown in FIG. 16. FIG. 17B is a graph showing the distribution of a magnetic field which is produced along the axial direction (z) from the center of the cylinder 24 when a solenoid coil 11 is powered for producing a magnetic field. The distribution shown in this graph indicates the magnetic field produced by the solenoid coil 11 in the form of relative values expressed as percentages of the value at the center of the cylinder 24. The area along the z-direction shown by the arrow (a) corresponds to the area shown by the arrow (a) in FIG. 17A.

The superconductor used for the cylinder 24 of this embodiment is a Nb—Ti/Nb/Cu multilayered sheet formed by cladding and rolling, and has a Jc-B characteristic shown in FIG. 18. The thickness of this multilayer sheet is 0.37 mm. As for the cylinder 24 shown in FIG. 16, a slit 31 is formed by butting insulated ends of a multilayered sheet which has a width of 128 mm and a thickness of 1.2 mm. The solenoid coil 11 is made of a Nb—Ti superconducting wire and has an outer diameter of 44 mm, an inner diameter of 40 mm and a height of 96 mm. This coil produces a central magnetic field of 0.764 T at 100 A. The magnetic flux measurement procedures in accordance with this embodiment comprise placing the solenoid coil 11 and the cylinder 24 in a cryostat (not shown), immersing them in liquid helium, exciting the solenoid coil 11 with an outer power supply and detecting, by means of a Hall probe, the magnetic flux density produced by this excitation.

Figure 19A:
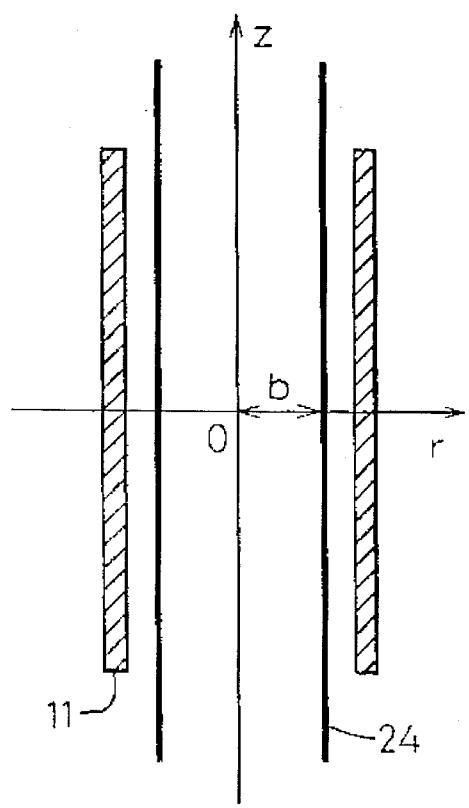
FIG. 19A is a sectional view of a schematic of the device of FIG. 16.
Figure 19B:
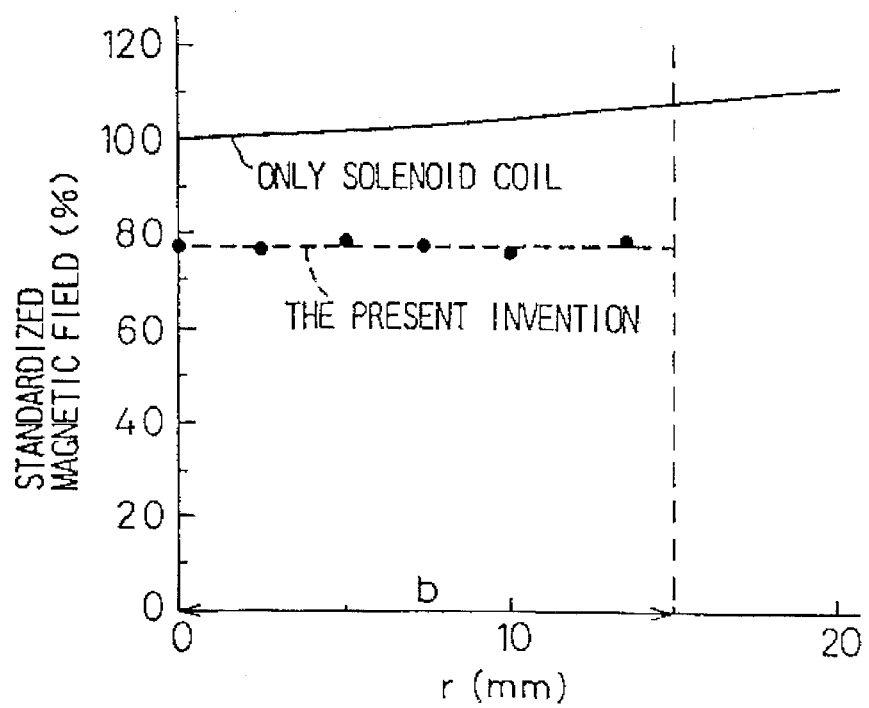
FIG. 19B is a graph showing a magnetic field distribution in the r-direction within the area indicated by the arrow (b) in FIG. 19A.

FIG. 19A shows a section taken along a plane parallel to the center axis of the cylinder 24. FIG. 19B shows the magnetic field distribution in the radial direction (r), that is to say, the magnetic field distribution in the z-axis direction which appears on the r-axis when the solenoid coil 11 is powered for the production of a magnetic field. In the same way as FIG. 17B, the distribution shown in FIG. 19B indicates a magnetic field produced by the solenoid coil 11 in the form of relative values expressed as the percentages of the value measured at the center of the cylinder 24. The area shown by the arrow (b) in FIG. 19B corresponds to the area shown by the arrow (b) in FIG. 19A.

Figure 20:
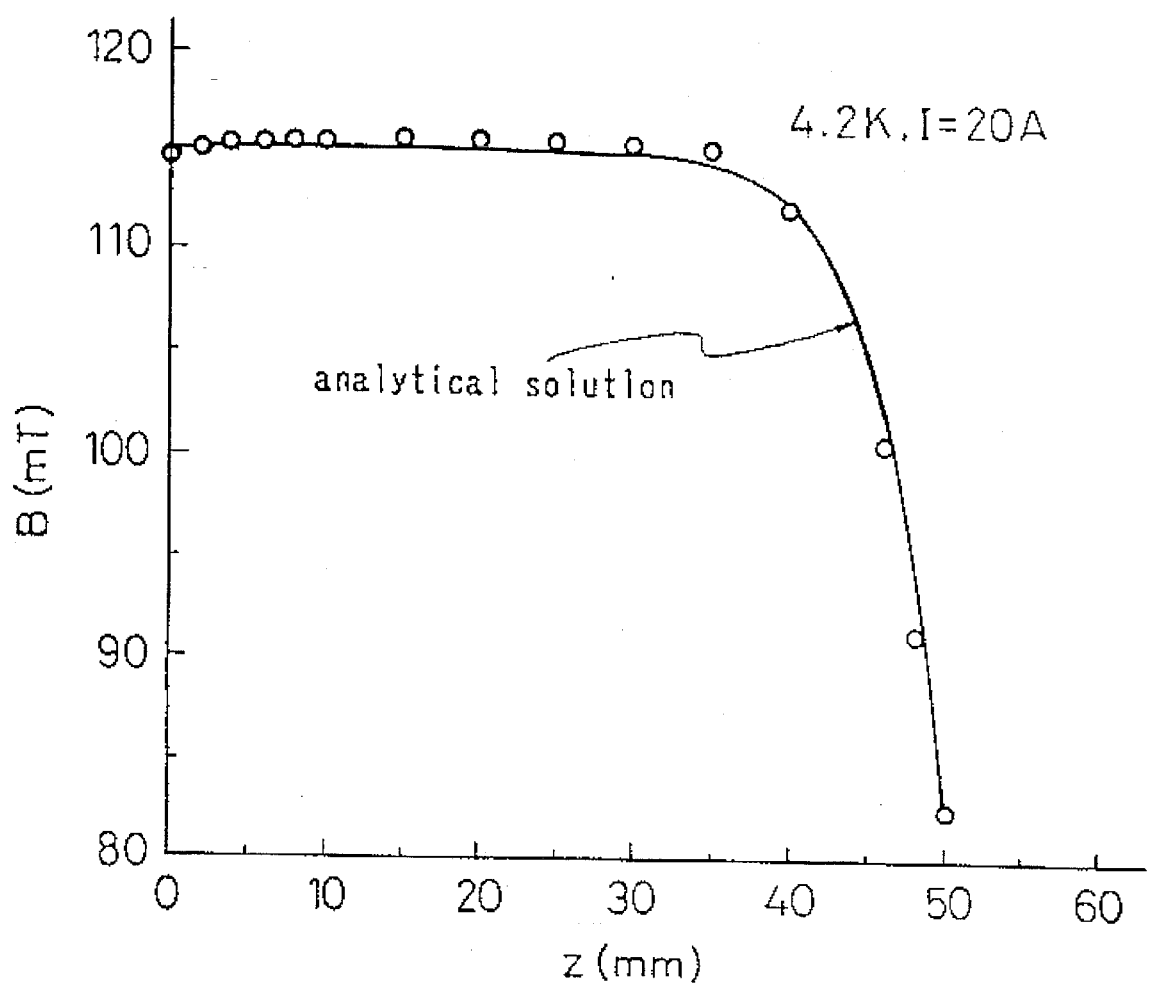
FIG. 20 is a graph showing the predicted values and actual values of a uniform field which is generated by the first embodiment of a magnetic field producing device according to the present invention.

As can be seen from FIG. 17B and FIG. 19B, according to the present invention, the area of a uniform, parallel magnetic field is greatly expanded. This effect is unchanged when the slit cylinder 24 is inserted into the solenoid coil 11 after the excitation of the solenoid coil 11. The measured values of the distribution shown in FIG. 17B correspond generally, as actual measured values, to the values (the solid line) shown in FIG. 20 which are predicted on the supposition that the cylinder 24 is perfectly diamagnetic.

Embodiment 2

Figure 21:
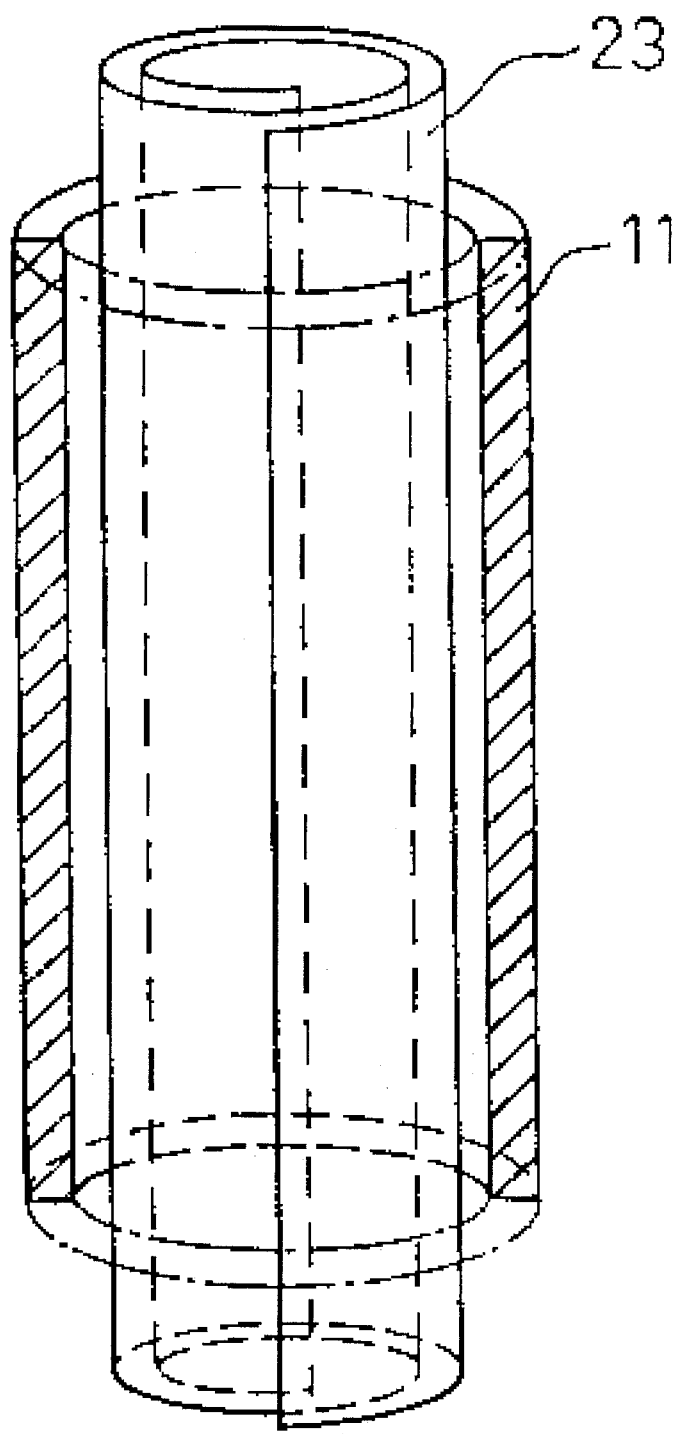
FIG. 21 is a perspective view, partially cut away, of the second embodiment of a magnetic field producing device according to the present invention.

FIG. 21 shows the second embodiment of a magnetic field producing device according to the present invention. The cylinder 23 of this embodiment has almost the same Jc-B characteristic as the multilayered sheet used in the first embodiment. In order to form the cylinder 23, a Nb—Ti/Nb/Cu multilayered sheet is rolled up six times in the form of a hollow cylinder with a thin insulating layer interposed between adjacent wraps. This multilayered sheet has a thickness of 0.19 mm and a width of 128 mm. This cylinder 23 has an outer diameter of 33 mm, an inner diameter of 30 mm and a height of 128 mm, and is placed inside the bore of the solenoid coil 11. This configuration is generally referred to as a "Swiss roll" form. In addition, for the purpose of a simple and easy description, a fewer number of the actual wraps are shown in FIG. 21. The magnetic field measurement in this embodiment was performed in the same way as that in the first embodiment.

According to the results of this measurement, almost the same magnetic field distribution as those shown in FIG. 17B and FIG. 19B was found and this shows that the area of a uniform, parallel magnetic field was greatly expanded. This effect was unchanged when the slit cylinder 24 was inserted into the solenoid coil 11 after the excitation of the solenoid coil 11.

Embodiment 3

Figure 22A:
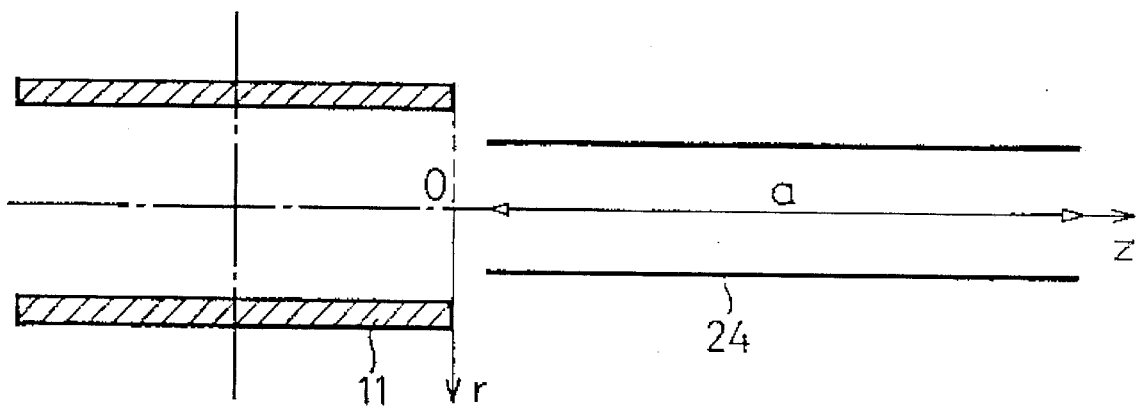
FIG. 22A is a sectional view of a schematic of the third embodiment of a magnetic field producing device according to the present invention.
Figure 22B:
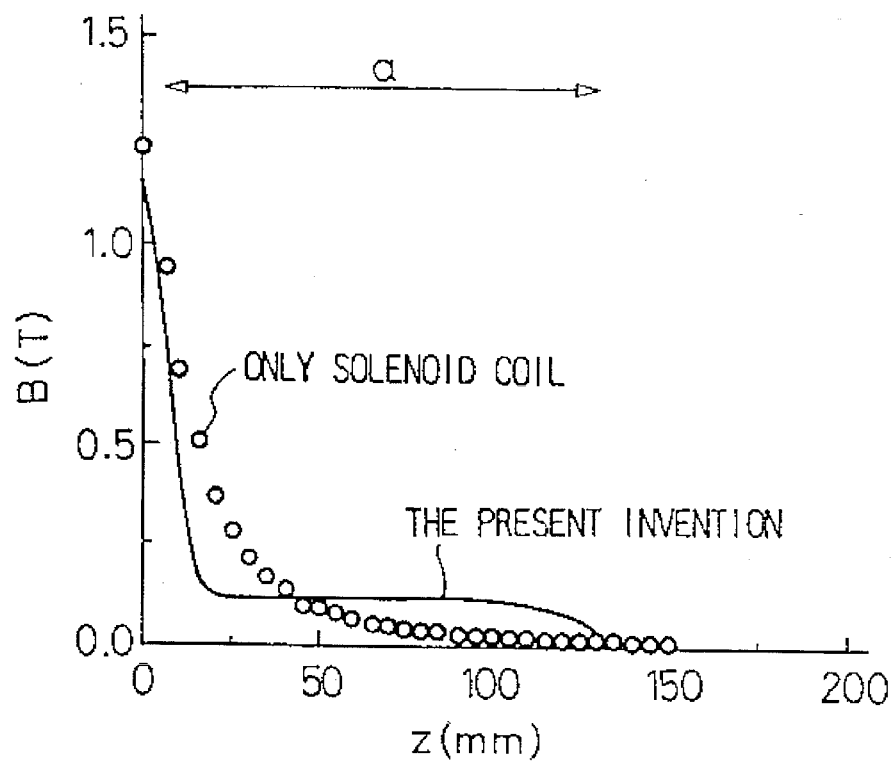
FIG. 22B is a graph showing a magnetic field distribution in the z-direction within the area indicated by the arrow (a) in FIG. 22A.

FIG. 22A and FIG. 22B show the third embodiment of a magnetic field producing device according to the present invention.

In the arrangement shown in FIG. 22A, the solenoid coil 11 is placed outside the slit cylinder 24 of the first embodiment and the solenoid coil 11 is spaced from the slit cylinder 24 by 6 mm along the z-axis direction of this figure. FIG. 22B shows the magnetic field distribution in the z-axis direction of FIG. 22A. The method and procedures of this embodiment are the same as those of the above-described embodiments. The area shown by the arrow (a) in FIG. 22B corresponds to the area on the z-axis shown by the arrow (a) in FIG. 22A. FIG. 22B shows that the area of a uniform, parallel magnetic field was also greatly expanded in this embodiment.

Embodiment 4

Figure 23A:
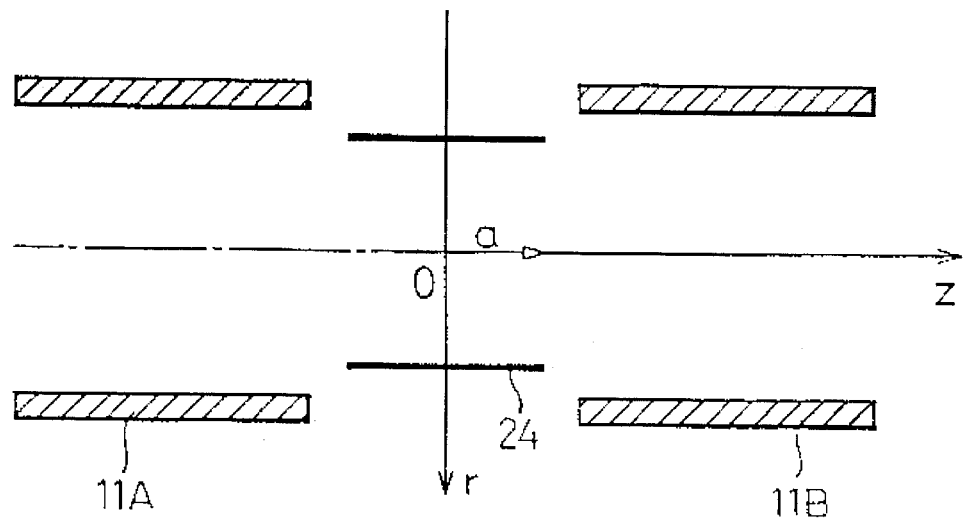
FIG. 23A is a sectional view of a schematic of the fourth embodiment of a magnetic field producing device according to the present invention.
Figure 23B:
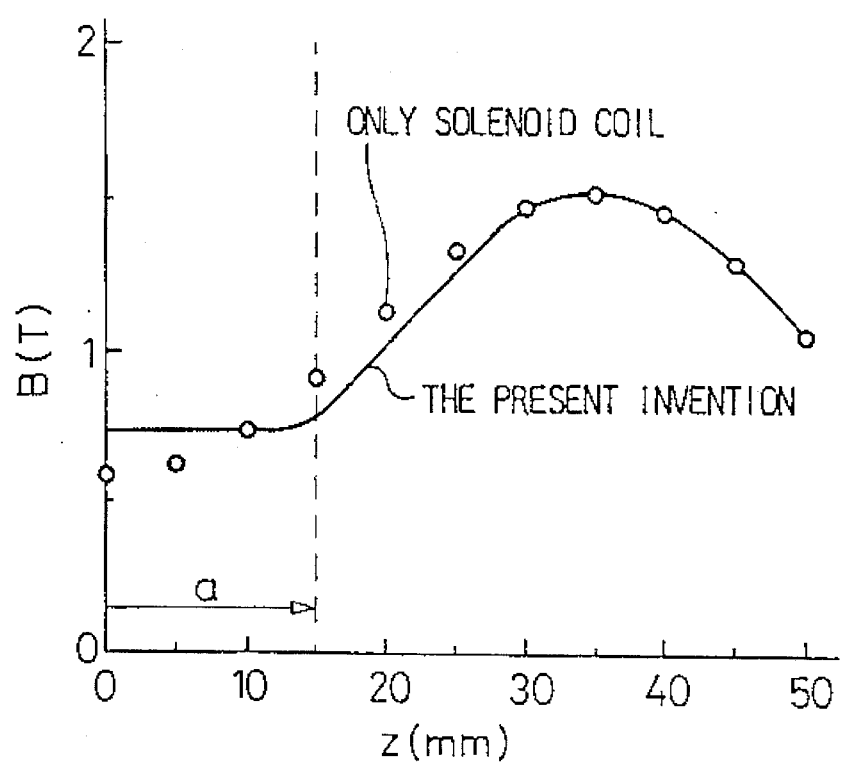
FIG. 23B is a graph showing the magnetic field distribution in the z-direction within the area indicated by the arrow (a) in FIG. 23A.

FIG. 23A and FIG. 23B show the fourth embodiment of a magnetic field producing device according to the present invention.

FIG. 23A schematically shows this embodiment. In this embodiment, the superconducting solenoid coils 11A, 11B each of which had an inner diameter of 40 mm, an outer diameter of 44 mm and a height of 30 mm are coaxial but spaced from each other by 40 mm. A high slit cylinder having a height of 30 mm similar to that of the first embodiment is placed between these solenoid coils 11A and 11B. These solenoid coils 11A, 11B are connected as a series circuit and are powered. The magnetic field measurement method and operation of this embodiment are also the same as those of the above-mentioned embodiments.

FIG. 23B shows the magnetic field distribution on the z-axis direction shown by the arrow (a) in FIG. 23A. As can be seen from FIG. 23B, it has been confirmed that the area of a uniform, parallel magnetic field is greatly expanded in this embodiment as well.

Figure 24:
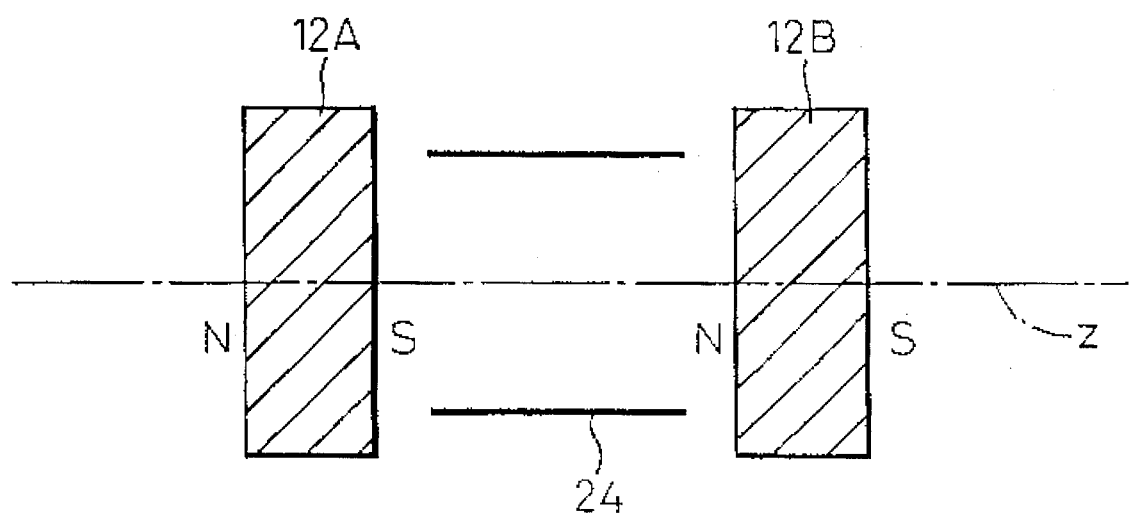
FIG. 24 is a sectional view of a schematic of a variant of the fourth embodiment in which the solenoid coils have been replaced with permanent magnets.

FIG. 24 shows a variant of this embodiment in which the solenoid coils 11A, 11B are replaced with permanent magnet 12A, 12B. It is obvious that the same result as that of each of the above-mentioned embodiments can also be obtained in this variant.

Embodiment 5

Figure 25A:
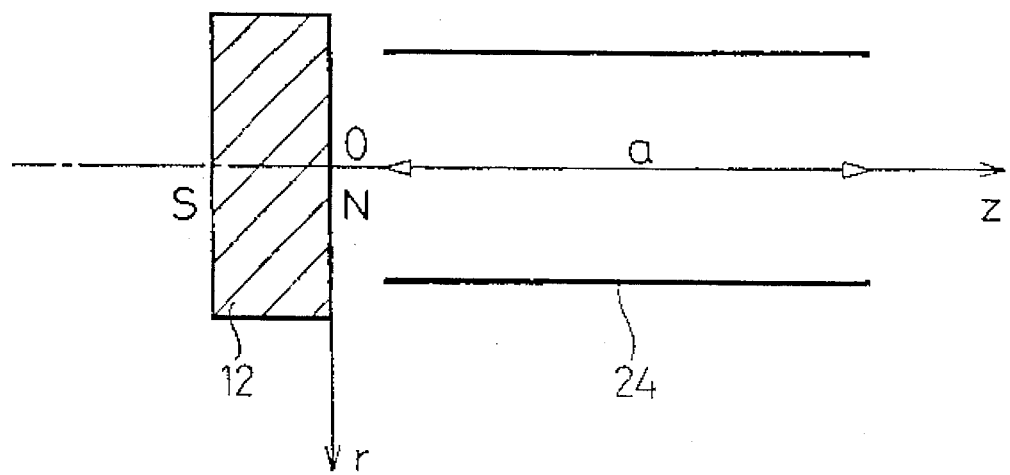
FIG. 25A is a sectional view of a schematic of the fifth embodiment of a magnetic field producing device according to the present invention.
Figure 25B:
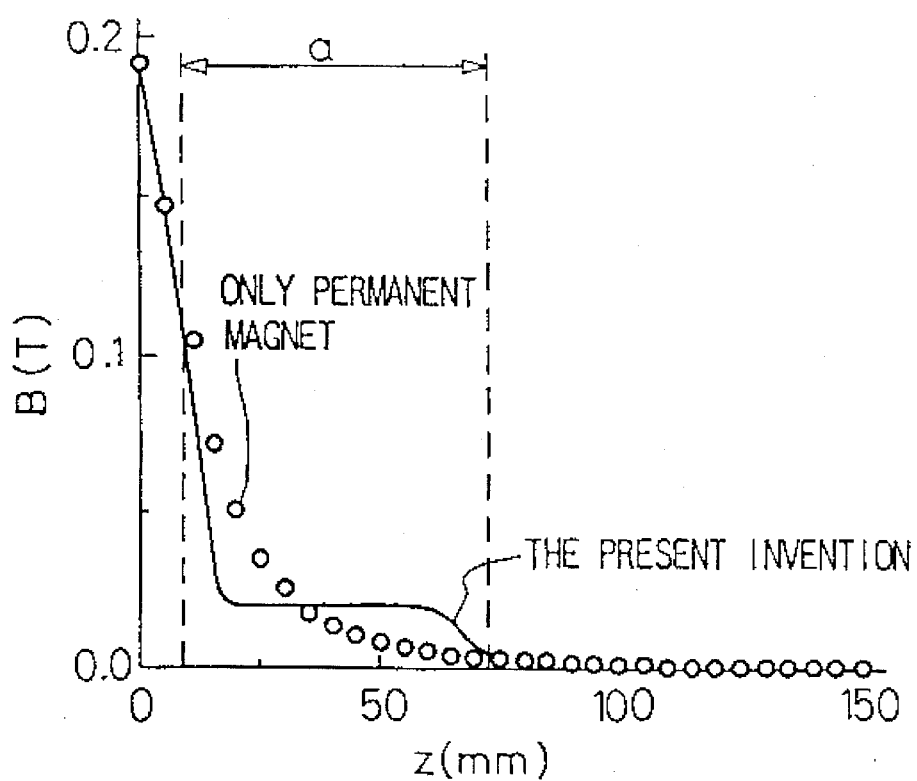
FIG. 25B is a graph showing a magnetic field distribution in the z-direction within the area indicated by the arrow (a) in FIG. 25A.

Furthermore, FIG. 25A and FIG. 25B show the fifth embodiment of a magnetic field producing device according to the present invention.

FIG. 25A shows this embodiment schematically. In this embodiment, a slit cylinder 24 having a height of 64 mm similar to that of the first embodiment is spaced from the N-pole side of a SmCo permanent magnet 12 by a distance of 10 mm. This SmCo permanent magnet 12 has a diameter of 40 mm and a thickness of 15 mm.

FIG. 25B shows the magnetic field distribution on the z-axis direction shown by the arrow (a) in FIG. 24. As can be seen from FIG. 25B, it was confirmed that the area of a uniform, parallel magnetic field is greatly expanded in this embodiment as well.

Embodiment 6

The sixth embodiment of a magnetic field producing device according to the present invention is described next.

Figure 26A:
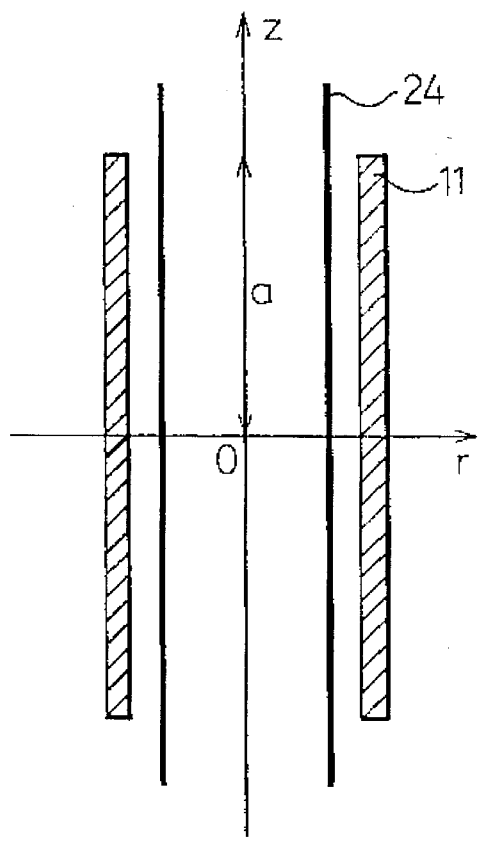
FIG. 26A is a sectional view of a schematic of the sixth embodiment of a magnetic field producing device according to the present invention.
Figure 26B:
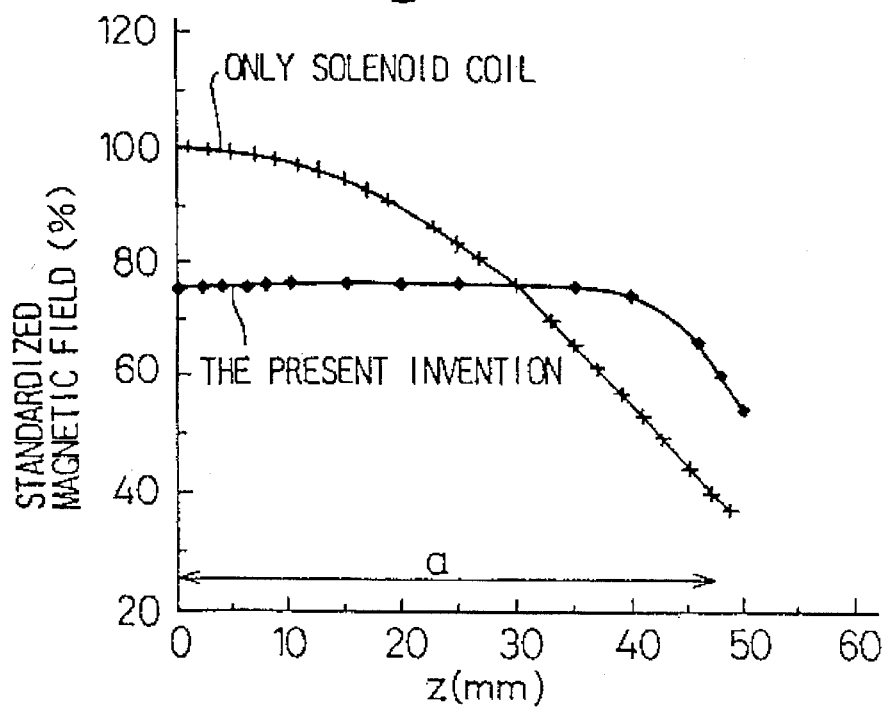
FIG. 26B is a graph showing a magnetic field distribution in the z-direction within the area indicated by the arrow (a) in FIG. 26A.

This embodiment is the same as that of the first embodiment except that the superconductor sheet used in the superconductor-containing cylinder 24 of the first embodiment is replaced with a Y—Ba—Cu—O multilayered sheet. FIG. 26A schematically shows of this embodiment. FIG. 26B shows the magnetic field distribution in the z-axis direction when this cylinder is at the liquid nitrogen temperature of 77.3K. These measurement positions correspond to the area on the z-axis shown by the arrow (a) in FIG. 26A.

The superconductor material used in this embodiment is $YBa_2Cu_3O_{7-y}$. The method for preparing this superconductor material comprises measuring $Y_2O_3$ powder, $BaO_2$ powder, $BaCuO_2$ powder and $CuO$ powder to prepare $YBa_2Cu_3O_{7-y}$ composition powder; kneading the $YBa_2Cu_3O_{7-y}$ composition powder in a ball mill for about 2 hours; pre-baking this kneaded powder for about 8 hours in an oxygen atmosphere under an 1 atm at 930° C.; and grinding this pre-baked powder in an agate mortar to yield a final powder having an average particle diameter of about 100 μm. In order to form the cylinder 24 of this embodiment, the above-mentioned final powder was poured into the space between the two walls of a non-magnetic, stainless-steel, double-walled pipe. Then this powder was compressed under an uniaxial pressure of 200 kg/cm³ for 10 minutes and was shaped into a hollow cylinder which had a thickness of 0.4 mm, an inner diameter of 30 mm and a height of 128 mm.

The solenoid coil 11 of this embodiment has an inner diameter of 40 mm, an outer diameter of 44 mm and a height of 96 mm, and is made of a Cu wire. This solenoid coil 11 produces a center magnetic field of 0.076 T when an electric current of 10 A is supplied to this coil. This solenoid coil 11 has almost the same coil constant as the solenoid coil of the first embodiment.

The procedures of the magnetic flux measurement in this embodiment comprise placing the solenoid coil 11 and the superconducting cylinder 24 in a cryostat; immersing them in liquid $N_2$; exciting the solenoid coil 11 with an outer power supply; and detecting, by means of a Hall probe, the magnetic flux density produced by this excitation.

The result of this measurement is shown in FIG. 26B. As can be seen from FIG. 26B, a uniform magnetic field almost the same as that produced by the first embodiment was obtained and the area of a uniform, parallel magnetic field was greatly expanded in this embodiment as well. This measurement result was unchanged when the slit cylinder 24 was inserted into the solenoid coil 11 after the excitation of the solenoid coil 11.

Embodiment 7

It has been confirmed that heat-treating the cylinder of the first embodiment, which is made of the superconducting Nb—Ti/Nb/Cu multilayered sheet, makes it possible to provide a desired magnetic field penetrating depth (d) ($d \approx B\mu_0 Jc$) of, for example, a magnetic field of 0.3 T.

It has been recognized that $d \leq \frac{1}{4} t$ is preferable, according to the relation between the ratio (d/t) of the magnetic field penetrating depth (d) to the thickness (t) of a superconductor and the divergence ($\Delta B/\Delta B_0$) from the perfect diamagnetism as shown in the above-described FIG. 14.

Furthermore, it has been confirmed that it is possible to provide a desired magnetic field penetrating depth (d) based on the number of wraps of the multilayered sheet used in the second embodiment.

It has been recognized that $d \leq \frac{1}{100} R$ is preferable, according to the relation between the ratio (d/R) of the magnetic field penetrating depth (d) to the radius (R) of the rolled-up hollow superconductor cylinder and the above-mentioned $\Delta B/\Delta B_0$ as shown in the above-described FIG. 15.

The present invention is not limited to the above-described embodiments. That is to say, although the slit cylinder is made of a Nb—Ti/Nb/Cu multilayered sheet in the above-described embodiments, it is possible to use a type II superconductor as long as its critical current density is equal to zero under a magnetic field higher than its lower critical magnetic field.

Furthermore, in order to stabilize a magnetic field produced by the device, it is desirable to fabricate the superconductor sheet in the form of a laminate in which a superconductor material is superimposed and bonded on a good conductor such as copper or silver along the sheet-thickness direction. In addition, it is also preferable to make holes such as vermicular holes in the superconductor sheet and to wrap this perforated sheet about itself several times so that a mutual overlapping of the holes of the sheet can be avoided as much as possible.

Figure 27:
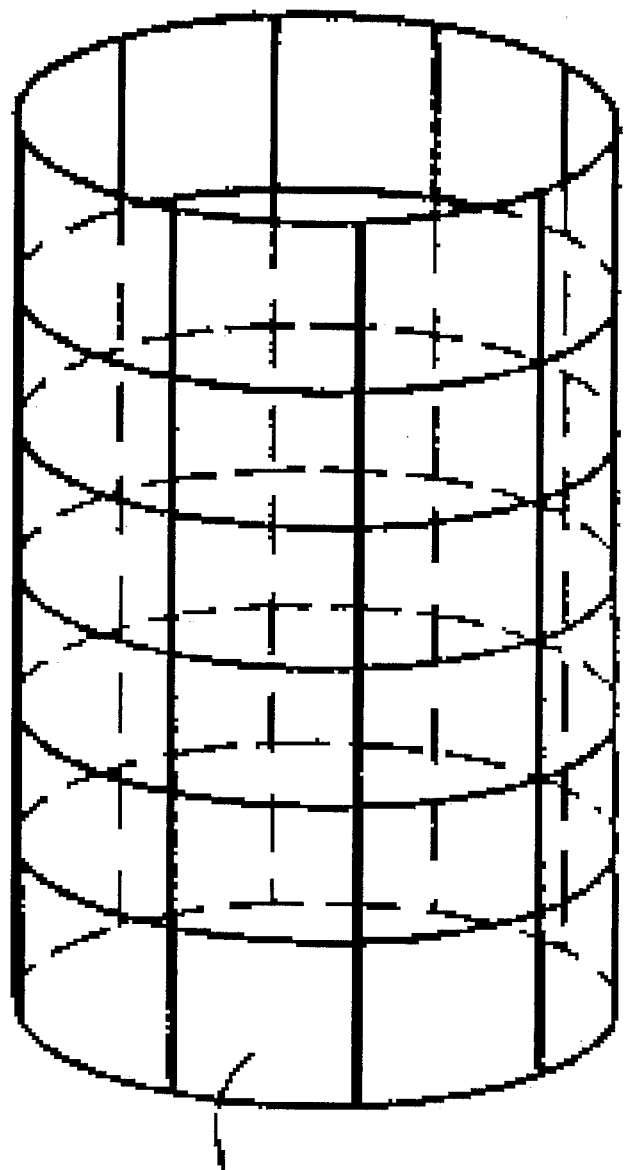
FIG. 27 is a perspective view of a schematic of a further embodiment of a magnetic field producing device according to the present invention.

In order to form the slit cylinder of the above-described embodiments, it is possible to wind a superconductor sheet about itself spirally several times or to wrap a superconductor sheet several times about itself to form a hollow cylinder. It is not always necessary that the slit of the cylinder extend parallel to the axis of the cylinder. This slit may extend spirally or have a stepwise configuration. Furthermore, in order to form the superconductor cylinder, several superconductor sheets 25 may be joined together in the form of a hollow cylinder as shown in FIG. 27.

Moreover, the superconductor body preferably has a circular section but it is possible to us a superconductor body having an elliptical or polygonal section.

Moreover, it is possible to make holes in the cylinder slit parallel to its axis within the limit that a magnetic field cannot be disturbed, and to use these holes for access to a uniform magnetic field space.

Moreover, the effect of the present invention is not dependent on the order of the operation for cooling the cylinder to its superconducting state and the operation for producing a magnetic field.

On the other hand, although superconducting solenoid coils or permanent magnets constitute the magnetic field source in each of the above-mentioned embodiments, the magnetic field source itself is not so limited. Furthermore, although the axis of the magnetic field source is parallel to the axis of the superconductor cylinder in each of the above-mentioned embodiments, the present invention can be practiced without these axes being parallel to each other.

Thus, according to the present invention, it becomes possible to produce a magnetic field which is more uniform and more stable in the axial direction of a superconductor cylinder than a magnetic field produced by known magnetic field producing devices.

Furthermore, although many superconducting coils need to be employed in a conventional magnetic field producing device, according to the present invention it is possible to produce a uniform magnetic field over a wide area along the axial and radial directions of a magnetic field producing device even when its magnetic field source comprises fewer or smaller coils.

As a result, it is possible to easily and economically produce a uniform, parallel magnetic field of required strength within a necessary space and to provide a magnetic field producing device which is very industrially useful.

For example, the present invention makes it possible to provide a nuclear magnetic resonance-computer tomograph having a rather compact main magnet and which can be manufactured economically.

We claim:

1. A device for producing a uniform, parallel, and intensity-variable magnetic field, said device comprising: a cylinder including a type II superconductor having a cylindrical shape and a slit extending from one axial end of the cylindrical superconductor to the other end thereof; magnetic field producing means for producing a magnetic field of an intensity greater than that of a lower critical magnetic field of said type II superconductor; said magnetic field producing means having a magnetic axis parallel to the longitudinal axis of said cylinder; said uniform, parallel, and intensity-variable magnetic field being produced inside said cylinder and in the axial direction of said cylinder; the thickness of said cylindrical superconductor in the radial direction thereof being greater than a thickness which allows, for a maximum value of a magnetic field on a surface of said cylinder, the magnetic field produced by said magnetic field producing means to penetrate half-way into the superconductor in said radial direction; said superconductor having a thickness more than four times as large as the distance the magnetic field penetrates the cylinder; and said cylinder having a radius more than a hundred times as large as said distance.

2. The device as defined in claim 1, wherein said cylinder comprises several sheets each of a superconductor and joined together so as to have a cylindrical shape.

3. The device as defined in claim 1, wherein said cylinder and said magnetic field producing means are coaxial.

4. The device as defined in claim 1, wherein said magnetic field producing means comprises a plurality of members spaced apart in an axial direction, and said cylinder is located between and is coaxial with said plurality of members of the magnetic field producing means.

5. The device as defined in claim 1, wherein said magnetic field producing means comprises a permanent magnet, and said cylinder is located to the side of a pole of said permanent magnet and coaxial with a magnetic axis of said magnet.

6. A device for producing a uniform, parallel, and intensity-variable magnetic field, said device comprising: a cylinder including a type II superconductor-containing sheet which is wound spirally about itself and has the form of a hollow cylinder; magnetic field producing means for producing a magnetic field of an intensity greater than that of a lower critical magnetic field of said type II superconductor; a magnetic axis of said magnetic field producing means and the longitudinal axis of said cylinder being parallel to each other; said uniform, parallel, and intensity-variable magnetic field being produced inside said cylinder and in the axial direction of said cylinder; the superconductor portion of the cylinder having a thickness in the radial direction of the cylinder greater than a thickness which allows, for a maximum value of a magnetic field on a surface of said cylinder, the magnetic field produced by said magnetic field producing means to penetrate half-way into said superconductor portion in said radial direction; said superconductor portion having a thickness more than four times as large as the distance the magnetic field penetrates the cylinder; and said cylinder having a radius more than a hundred times as large as said distance.

7. The device as defined in claim 6, wherein said cylinder comprises several sheets each of a superconductor and joined together so as to have a cylindrical shape.

8. The device as defined in claim 6, wherein said cylinder and said magnetic field producing means are coaxial.

9. The device as defined in claim 6, wherein said magnetic field producing means comprises a plurality of members spaced apart in an axial direction, and said cylinder is located between and is coaxial with said plurality of members of the magnetic field producing means.

10. The device as defined in claim 6, wherein said magnetic field producing means comprises a permanent magnet, and said cylinder is located to the side of a pole of said permanent magnet and coaxial with a magnetic axis of said magnet.

11. A device for producing a uniform, parallel, and intensity-variable magnetic field, said device comprising: a cylinder including a type II superconductor-containing sheet rolled up several times about itself in the form of a hollow cylinder; magnetic field producing means for producing a magnetic field of an intensity greater than that of a lower critical magnetic field of said type II superconductor; a magnetic axis of said magnetic field producing means and the longitudinal axis of said cylinder being parallel to each other; said uniform, parallel, and intensity-variable magnetic field being produced inside said cylinder and in the axial direction of said cylinder; said cylindrical superconductor having a thickness in the radial direction of the cylinder greater than a thickness which allows, for a maximum value of a magnetic field on a surface of said cylinder, the magnetic field produced by said magnetic field producing means to penetrate half-way into the superconductor portion in said radial direction; said cylindrical superconductor having a thickness more than four times as large as the distance the magnetic field penetrates the cylinder; and said cylinder having a radius more than a hundred times as large as said distance.

12. The device as defined in claim 11, wherein said cylinder comprises several sheets each of a superconductor and joined together so as to have a cylindrical shape.

13. The device as defined in claim 11, wherein said cylinder and said magnetic field producing means are coaxial.

14. The device as defined in claim 11, wherein said magnetic field producing means comprises a plurality of members spaced apart in an axial direction, and said cylinder is located between and is coaxial with said plurality of members of the magnetic field producing means.

15. The device as defined in claim 11, wherein said magnetic field producing means comprises a permanent magnet, and said cylinder is located to the side of a pole of said permanent magnet and coaxial with a magnetic axis of said magnet.

* * * * *